United States Patent
Hinata et al.

(10) Patent No.: US 12,096,653 B2
(45) Date of Patent: Sep. 17, 2024

(54) DISPLAY APPARATUS, PHOTOELECTRIC CONVERSION APPARATUS, AND ELECTRONIC APPARATUS

(71) Applicant: CANON KABUSHIKI KAISHA, Tokyo (JP)

(72) Inventors: Shoma Hinata, Kanagawa (JP); Hiroaki Sano, Kanagawa (JP); Yojiro Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 362 days.

(21) Appl. No.: 17/454,544

(22) Filed: Nov. 11, 2021

(65) Prior Publication Data
US 2022/0158134 A1    May 19, 2022

(30) Foreign Application Priority Data
Nov. 19, 2020    (JP) .................................. 2020-192212

(51) Int. Cl.
| | |
|---|---|
| *H10K 50/858* | (2023.01) |
| *G02B 3/00* | (2006.01) |
| *H10K 59/12* | (2023.01) |
| *H10K 59/38* | (2023.01) |

(52) U.S. Cl.
CPC ......... *H10K 50/858* (2023.02); *G02B 3/0056* (2013.01); *H10K 59/12* (2023.02); *H10K 59/38* (2023.02)

(58) Field of Classification Search
CPC .................................................... H10K 50/858
USPC ........................................................ 313/506
See application file for complete search history.

(56) References Cited

U.S. PATENT DOCUMENTS

| | | | |
|---|---|---|---|
| 11,605,801 B2* | 3/2023 | Sano | H10K 59/65 |
| 2019/0056543 A1 | 2/2019 | Ueda | |
| 2020/0357854 A1 | 11/2020 | Koshihara | |
| 2020/0358036 A1 | 11/2020 | Yokoyama | |
| 2021/0057678 A1 | 2/2021 | Motoyama | |
| 2021/0273203 A1* | 9/2021 | Sano | H10K 50/858 |
| 2022/0344622 A1* | 10/2022 | Cai | H10K 50/858 |
| 2023/0269993 A1* | 8/2023 | Sekine | G09F 9/30 |
| | | | 257/40 |

FOREIGN PATENT DOCUMENTS

| | | | | |
|---|---|---|---|---|
| CN | 114551524 A | * | 5/2022 | ........... H01L 27/156 |
| WO | 2017169563 A1 | | 10/2017 | |
| WO | 2020111101 A1 | | 6/2020 | |

* cited by examiner

*Primary Examiner* — Christopher M Raabe
(74) *Attorney, Agent, or Firm* — Canon U.S.A., Inc. IP Division

(57) ABSTRACT

A display apparatus includes a plurality of pixels arranged on a surface of a substrate, the plurality of pixels including a first pixel including a first sub-pixel that includes a first light emitting element and emits light of a first color and a second sub-pixel that includes a second light emitting element and emits light of a second color, a first lens disposed on a first light emitting area of the first light emitting element, and a second lens disposed on a second light emitting area of the second light emitting element. A vector from a center of the first light emitting area in plan view from a direction perpendicular to the main surface to an apex of the first lens differs from a vector from a center of the second light emitting area to an apex of the second lens in plan view from the direction.

21 Claims, 17 Drawing Sheets

| COMPONENT | NORMAL DIRECTION ($\theta=0°$) | OBLIQUE DIRECTION ($\theta=40°$) |
|---|---|---|
| BLUE | 1.49 | 2.17 |
| GREEN | 1 | 1 |
| RED | 0.42 | 0.41 |

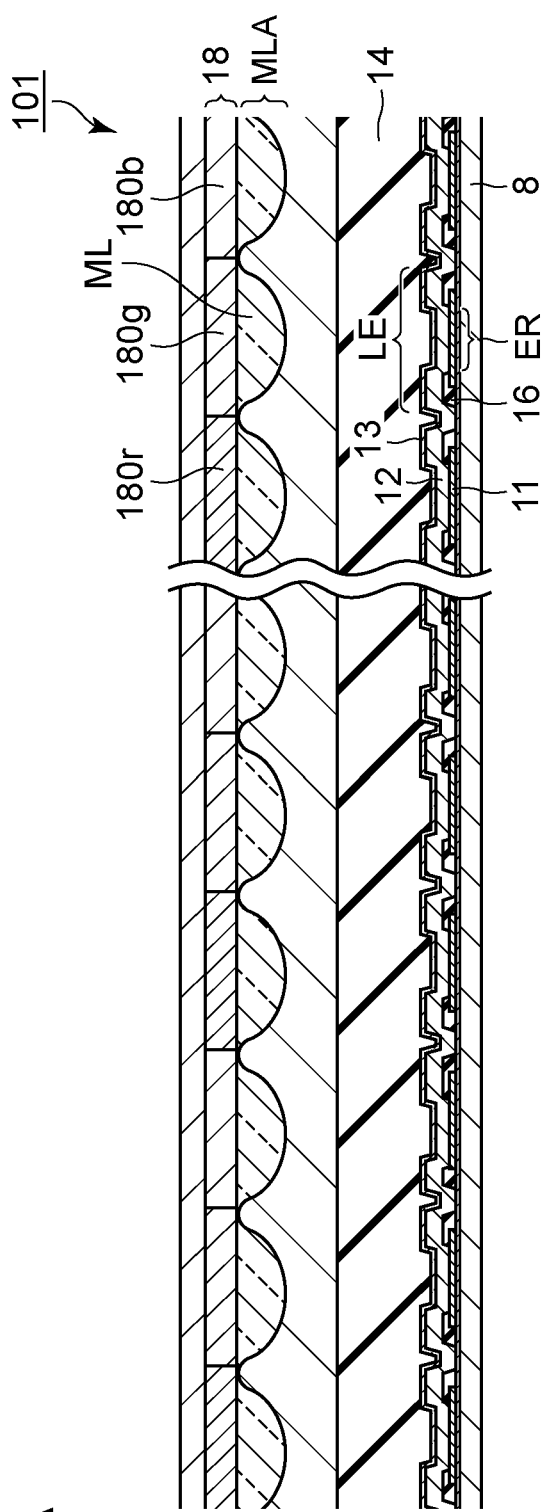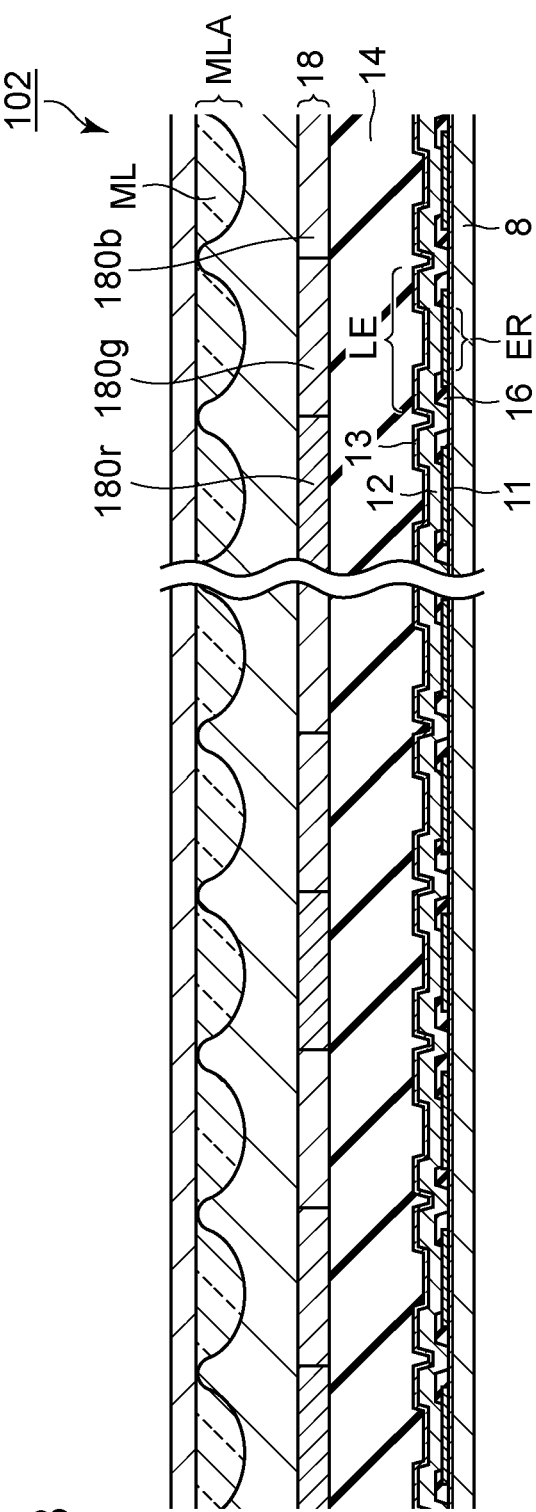

DISPLAY APPARATUS, PHOTOELECTRIC CONVERSION APPARATUS, AND ELECTRONIC APPARATUS

BACKGROUND

Field of the Disclosure

The present disclosure relates to a display apparatus, a photoelectric conversion apparatus, and an electronic apparatus.

Description of the Related Art

Organic electroluminescence (EL) devices are light emitting elements including a pair of electrodes and an organic compound layer including a light emitting layer disposed therebetween. Organic EL devices are being put into practical use as light emitting elements for thin-screen displays, lighting apparatuses, head mounted displays (HMDs), electronic viewfinders (EVFs) of digital cameras, light sources for the print heads of electrophotographic printers and so on by taking advantages of excellent features such as surface emission characteristics, light weight, and high visibility.

International Publication No. 2017/169563 discloses an example of a display apparatus having a display surface with a relatively small area, such as an HMD and an EVF, in which an image is formed on a user's eyeball through an optical system, such as a lens. FIG. 1 illustrates an example in which a display apparatus 2 is used together with a magnifying optical system 6. The broken lines in FIG. 1 indicate light rays emitted from the display area of the display apparatus 2 into the eye through the magnifying optical system 6.

As shown in FIG. 1, for the center of the display area, light rays emitted in the direction of normal to the display area are used, and for the periphery of the display area, light rays emitted in oblique directions (in the directions inclined with respect to the normal direction) are used.

The display apparatus described in International Publication No. 2017/169563 is a "white plus color filter (CF) method" organic EL display in which white light is radiated from an organic compound layer, and the radiated white light passes through a color filter (CF), so that one of red light, green light, and blue light is extracted. In the display apparatus with this configuration, the light emitted from the organic compound layer in oblique directions may pass through the CF of an adjacent sub-pixel, not a CF that lies directly thereon, into the user's eyeball.

The light passing through the CF of the adjacent sub-pixel becomes light of a color different from a desired color, causing color mixture. Thus, International Publication No. 2017/169563 describes prevention of color mixture by shifting the CFs of the periphery of the display area from the center with respect to the light emitting surface in plan view.

Even if light is made incident on the user's eyeball through an appropriate CF for each pixel, as in International Publication No. 2017/169563, color misregistration between the center and the periphery of the display area sometimes occurs when a color with the same intensity and chromaticity (for example, white with the same luminance) is displayed at the center and the periphery. The color misregistration between the center and the periphery of the display area decreases the display quality.

SUMMARY

Accordingly, the present disclosure improves the display quality of display apparatuses.

A display apparatus according to an aspect of the present disclosure includes a plurality of pixels arranged on a main surface of a substrate, the plurality of pixels including a first pixel including a first sub-pixel that includes a first light emitting element and emits light of a first color and a second sub-pixel that includes a second light emitting element and emits light of a second color, a first lens disposed on a first light emitting area that is a light emitting area of the first light emitting element, and a second lens disposed on a second light emitting area that is a light emitting area of the second light emitting element. A vector from a center of the first light emitting area in plan view from a direction perpendicular to the main surface to an apex of the first lens differs from a vector from a center of the second light emitting area to an apex of the second lens in plan view from the direction perpendicular to the main surface.

Further features of various embodiments will become apparent from the following description of exemplary embodiments with reference to the attached drawings.

BRIEF DESCRIPTION OF THE DRAWINGS

FIG. 9A is a schematic cross-sectional view of a modification of the display apparatus according to the first embodiment, illustrating the configuration thereof.

FIG. 9B is a schematic cross-sectional view of a modification of the display apparatus according to the first embodiment, illustrating the configuration thereof.

DESCRIPTION OF THE EMBODIMENTS

The details of display apparatuses according to embodiments of the present disclosure will be described hereinbelow with reference to the drawings. It is to be understood that the embodiments are merely examples of the present disclosure, and the numerical values, shapes, materials, components, the disposition and connection configurations of the components do not limit the present disclosure. The embodiments describe a plurality of features, but not all of the features are required for every embodiment. The features may be freely combined. In the attached drawing, the same or similar components are denoted by the same reference signs, and duplicated descriptions will be omitted.

First, a technical context will be described.

<Color Misregistration Depending on Observation Direction>

Figures 2A, 2B:
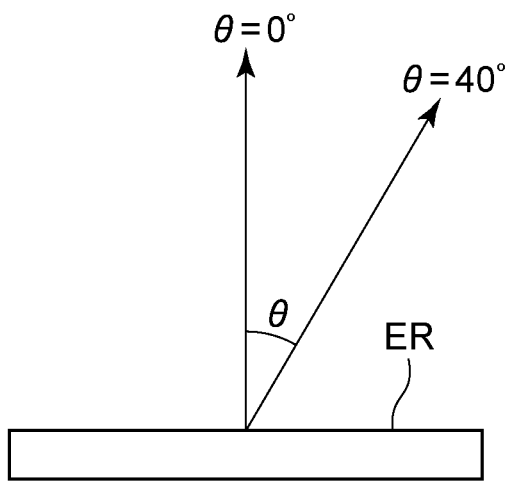
FIGS. 2A and 2B are a schematic diagram and a table illustrating the relationship between the angle and the chromaticity of light emitted from a light emitting area.

The relationship between the output angle of light emitted from a light emitting area and chromaticity will be described with reference to FIGS. 2A and 2B. FIG. 2A schematically illustrates, of the light emitted from the light emitting area ER of a light emitting element, the light emitted from the light emitting element at an output angle θ=0° (in the normal direction) and the light emitted from the light emitting element at an output angle θ=40° (in an oblique directions). In this example, the light emitting element emits white light. FIG. 2B illustrates the result of normalizing the peak intensities of a red component (580 nm to 780 nm) and a blue component (400 nm to 490 nm) included in the light emitted from the light emitting element, with the peak intensity of a green component (490 nm to 580 nm) as 1. FIG. 2B shows that the intensity ratio of the red component, the green component, and the blue component (hereinafter referred to as "color component ratio") differ between the light emitted in the normal direction and the light emitted in the oblique direction.

This shows that the color of light emitted from the light emitting element differs between a case where the light emitting element is observed from the direction perpendicular to the surface and a case where the light emitting element is observed from an oblique direction with respect to the surface, that is, the chromaticity differs. For example, the example shown in FIG. 2B shows that, assuming that the light observed from the direction perpendicular to the surface of the light emitting element is white, the light observed from the oblique direction (θ=40°) is higher in the intensity of the blue component than that when observed from the vertical direction.

Figure 1:
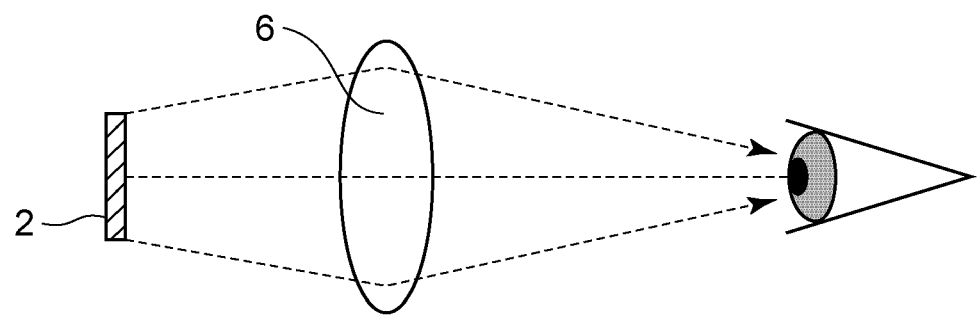
FIG. 1 is a schematic diagram illustrating light rays when a display apparatus is observed through a magnifying optical system.

Suppose that a display apparatus in which a plurality of pixels is arranged over the whole display area, each pixel including the foregoing light emitting element, is observed through a magnifying optical system. As shown in FIG. 1, for the pixels at the center of the display area, the light emitted in the direction of the normal to the display surface is incident on the user's eyeball, but for the pixels on the periphery of the display area, the light emitted in oblique directions with respect to the direction of the normal to the display surface is incident on the user's eyeball. Since the color component ratio of the light emitted from the light emitting element differs between in the normal direction and in the oblique directions, the light from the pixels at the center of the display area is visually recognized as white, but the light from the pixels on the periphery of the display area is visually recognized as bluish color.

<Refraction of Light by Microlens>

Figure 3:
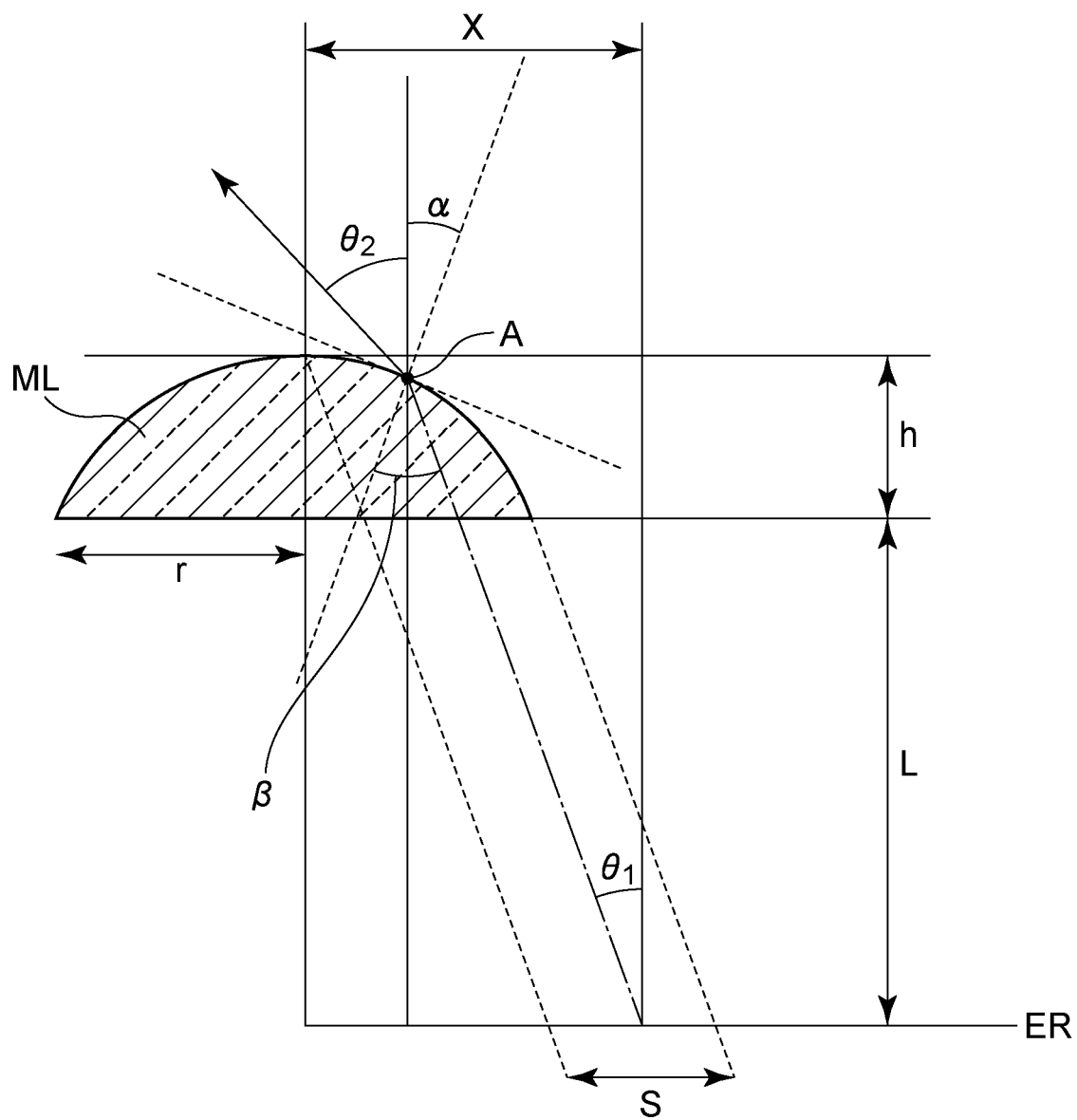
FIG. 3 is a cross-sectional view of a display apparatus illustrating the relationship between the arrangement of a light emitting area and a microlens and the light.

FIG. 3 is a cross-sectional view of a display apparatus illustrating the relationship between a light emitting area ER and a microlens ML when the center of the light emitting area ER is displaced from the apex of the microlens ML. The words "A is displaced from B" refers to arranging A and B with a certain distance therebetween so that A and B are not aligned in plan view when seen from the direction perpendicular to a substrate 8. In FIG. 3, h is the height of the microlens ML, r is the radius of the microlens ML, and n is the refractive index. The light emitted through the micro lens ML is output to a medium with a refractive index of 1 (typically, air).

As shown in FIG. 3, the light is emitted from the light emitting area ER at an angle of $θ_1$ and is bent at an angle of $θ_2$ at point A of the microlens ML. Here, α is the inclination of the surface of the microlens ML at point A with respect to the tangent, and β is ($α+θ_1$). Eq. 1 holds according to Snell's law. Eq. 2 is the solution of Eq. 1 for $θ_1$.

$$1×\sin(θ_2+α)=n×\sin(θ_1+α) \qquad \text{Eq. 1}$$

$$θ_1=\sin^{-1}\{\sin(θ_2+α)/n\}-α \qquad \text{Eq. 2}$$

As shown in FIG. 3, the angle $θ_2$ of the light incident on the area where α is positive, that is, the area to the right of the apex of the microlens ML in FIG. 3, is larger than $θ_1$, and thus the light is radiated at a wider angle. Actually, a protective layer and so on are disposed between the microlens ML and the light emitting area ER. For this reason, the relationship between the output angle $θ_1$ of the light from the light emitting area ER and the output angle $θ_2$ of the light from the microlens ML is not simply determined only from the above equations. However, the configuration in which the microlens ML is displaced from the light emitting area ER may increase the emission intensity in a specific direction using the above mechanism.

Figure 4A:
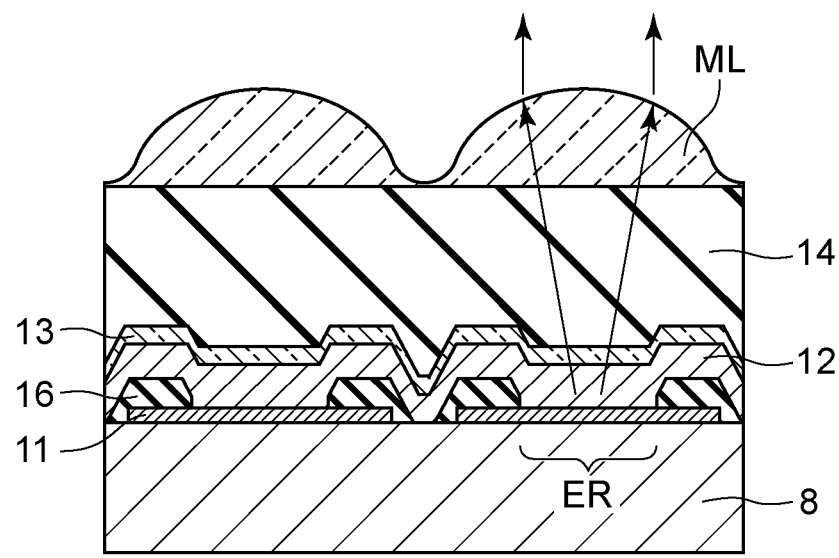
FIGS. 4A and 4B are cross-sectional views of part of a display apparatus illustrating the relationship between the arrangement of a light emitting area and a microlens and the light.
Figure 4B:
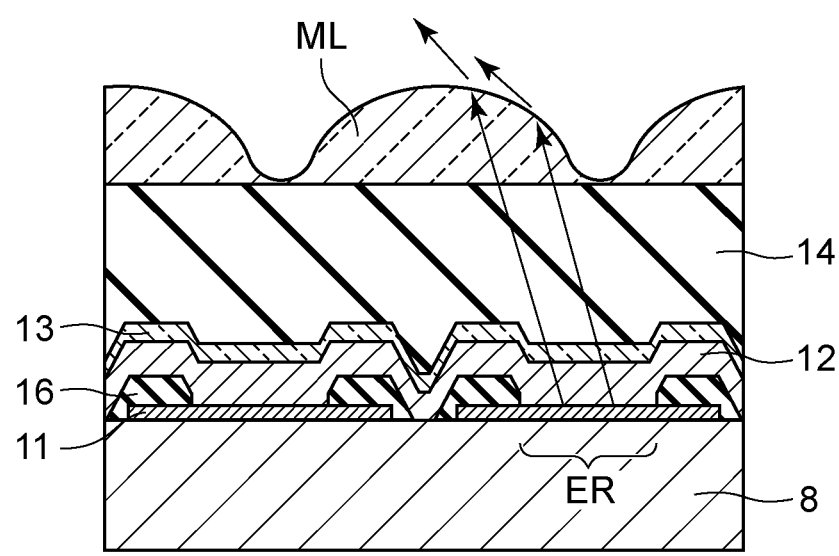

FIG. 4A is a cross-sectional view of part of a display apparatus illustrating a case where the apex of the microlens ML is not displaced from the center of the light emitting area ER. FIG. 4B is a cross-sectional view of part of a display apparatus illustrating a case where the apex is displaced from the center of the light emitting area ER. Disposing the microlens ML, with the apex not displaced from the center of the light emitting area ER, as shown in FIG. 4A, allows for increasing the intensity of the light that exits in the direction perpendicular (normal) to the main surface of the substrate 8. In contrast, disposing the microlens ML, with the apex displaced from the center of the light emitting area ER, as shown in FIG. 4B, allows for refracting the light emitted from the light emitting element in oblique directions, thereby increasing the intensity of the light that exits in the oblique directions. Thus, the intensity of the light exiting in a specific direction can be increased depending on the position of the microlens ML. The intensity of the light that exits from the microlens ML at an output angle $\theta_2$ may be determined from the area of a region S that satisfies the relationship between the intensity and the angle of light that exits from the light emitting element at an angle $\theta_1$ determined at the individual point of the microlens ML (FIG. 3). If $\theta_2>0$, the intensity of the light that exits at the output angle $\theta_2$ increases as the amount of displacement X (lens displacement amount) of the apex of the microlens ML from the center of light emitting area ER is increased from 0. The intensity becomes the maximum at a certain displacement amount X and decreases when the displacement amount S exceeds the amount. In other words, a displacement amount for maximizing the output angle $\theta_2$ may exist.

<Adjusting Light Amount by Setting Lens Displacement Amount>

Setting the lens displacement amount for each color allows adjusting the intensity of the light emitted at the output angle $\theta_2$ for each color. Adjusting the intensity for each pixel according to the position of the pixel in the display area allows uniformizing the ratio of color components of the light from the pixels incident on the user's eyeball.

In the example of FIG. 2B, of the plurality of pixels, for each pixel in which the light emitted at an output angle of 40° is incident on the user's eyeball, the light intensity of red pixels and green pixels is increased relative to the intensity of the green pixels. More specifically, the lens displacement amount is changed among red pixels, green pixels, and blue pixels so that the light intensity of the red pixels and the green pixels is about 1.46 (=2.17/1.49) times the intensity of the blue pixels. This prevents the color misregistration between the pixels that emit light at an output angle of 40° and the central pixels.

The color-by-color setting of the lens displacement amount may be such that the emission intensity of specific color sub-pixels is higher than that of the other color sub-pixels, the emission intensity of specific color sub-pixels is lower than that of the other color sub-pixels, or a combination thereof. In the example of FIG. 2B, for the red pixels and the green pixels, lens displacement amounts may be set so that the emission intensity at a certain output angle $\theta_2$ becomes the largest, and for the blue pixels, a lens displacement amount smaller than that may be set. Alternatively, for the red pixels and the green pixels, lens displacement amounts may be set sot that the emission intensity at a certain output angle $\theta_2$ becomes the largest, and for the blue pixels, a lens displacement amount larger than that may be set. This allows decreasing the amount of outgoing light that satisfies the relation of Eq. 2, thereby relatively decreasing the emission intensity of the blue component at the output angle $\theta_2$. This enables the color component ratio at the output angle $\theta_2$ to come close the color component ratio in the normal direction.

The lens displacement amount refers to the relative displacement amount between the apex of the microlens ML and the center of the light emitting area ER in plan view, as described above. The lens displacement amount may be set by displacing the apex of the microlens ML from the center of the light emitting area ER, by displacing the center of the light emitting area ER from the apex of the microlens ML, or by combining them. The center of the light emitting area ER is the center of gravity of the figure defined by the outer edge of an area that emits light as viewed from a direction perpendicular to the light emitting surface.

Some embodiments implement a solution to displace microlenses from the center of the light emitting area of the light emitting element in plan view and to adjust the lens displacement amount for each sub-pixel.

First Embodiment

Referring to FIGS. 5 to 11, a display apparatus according to a first embodiment of the present disclosure will be described.

<Overall Configuration of Organic Light Emitting Apparatus>

Figure 5:
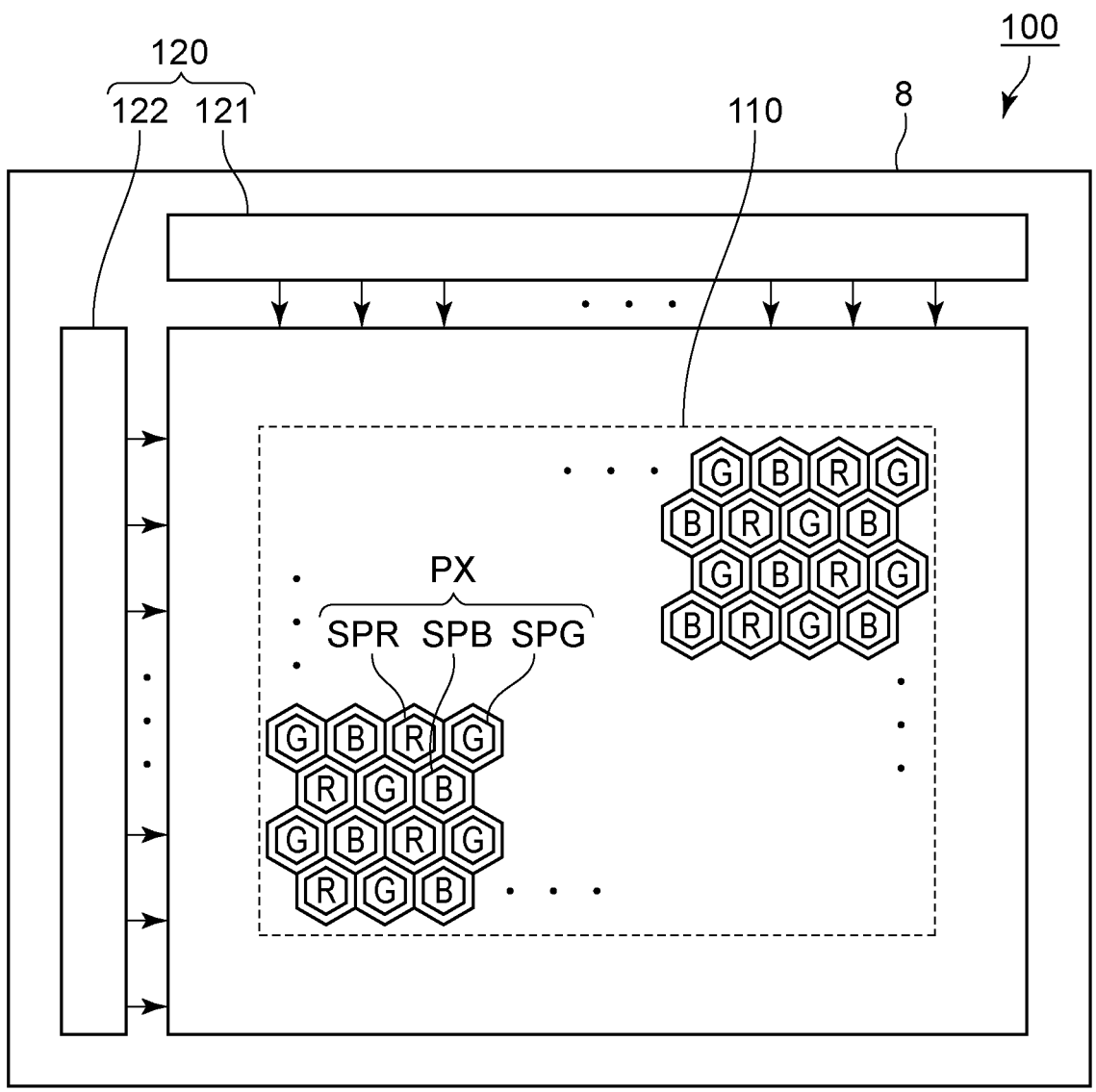
FIG. 5 is a plan view of a display apparatus according to a first embodiment, illustrating the configuration thereof.

FIG. 5 is a plan view of a display apparatus 100 according to a first embodiment, illustrating the configuration thereof. The display apparatus 100 includes a display area 110 in which a plurality of pixels PX is arranged in a two-dimensional array on the substrate 8 (on the substrate) and a peripheral circuit 120. The peripheral circuit 120 is a circuit for displaying an image in the display area 110. The peripheral circuit 120 may include a signal-line driving circuit 121 (a signal output circuit) and a signal-line driving circuit 122 (a vertical scanning circuit).

Each pixel of the plurality of pixels PX includes a plurality of sub-pixels SP. In this embodiment, each of the pixels PX includes three kinds of sub-pixels SP, that is, a sub-pixel SPR that emits light of a first color (first color light), a sub-pixel SPB that emits light of a second color (second color light), and a sub-pixel SPG that emits light of a third color (third color light). The three sub-pixels SP of a first pixel PX1 of the plurality of pixels PX are referred to as a first sub-pixel SP1, a second sub-pixel SP2, and a fifth sub-pixel SP5. The three sub-pixels SP of a second pixel PX2 of the pixels PX are referred to as a third sub-pixel SP3, a fourth sub-pixel SP4, and a sixth sub-pixel SP6. In this embodiment, the first pixel PX1 is disposed closer to the periphery of the display area 110 than the second pixel PX2. In other words, the second pixel PX2 is disposed closer to the center of the display area 110 than the first pixel PX1. The center of the display area 110 may be the center of gravity of the outer shell of the display area 110. The first sub-pixel SP1 and the third sub-pixel SP3 are the sub-pixels SPR that emit the first-color light. The second sub-pixel SP2 and the fourth sub-pixel SP4 are the sub-pixels SPB that emit the second color light. The fifth sub-pixel SP5 and the sixth sub-pixel SP6 are the sub-pixels SPG that emit the third color light. The first color, the second color, and the third color are red, blue, and green, respectively.

The configuration of the pixels PX described here is given for mere illustrative purposes and is not limited to the above configuration.

For example, each of the plurality of pixels PX may include a sub-pixel SPW that emits light of a fourth color (fourth color light), in addition to the sub-pixel SPR, the sub-pixel SPB, and the sub-pixel SPG. The fourth color may be either white or yellow, for example. This embodiment illustrates an example in which the sub-pixels SP are arranged in a delta arrangement. This is given for mere illustrative purposes. The sub-pixels SP may be arranged in a stripe arrangement, a square arrangement, or a Bayer arrangement, for example. In this specification, a specific kind of sub-pixel or a specific sub-pixel of the sub-pixels SP is denoted by a reference sign with a subscription, such as sub-pixel SPB or sub-pixel SP1. A sub-pixel that is referred to without specifying the kind of the sub-pixel is simply referred to as "sub-pixel SP". This applies also to the other components.

<Configuration of Sub-Pixel>

Figure 6A:
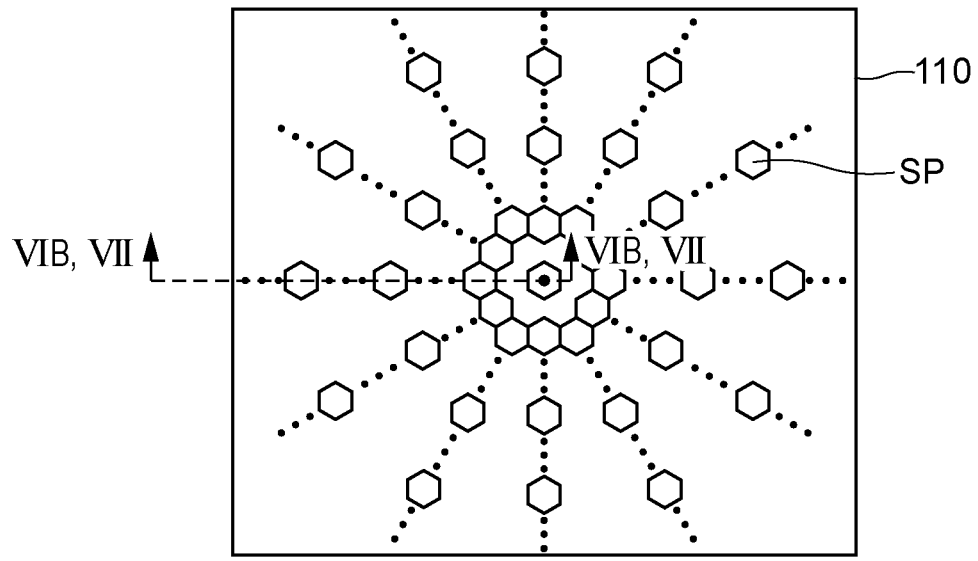
FIG. 6A is a plan view of the display apparatus according to the first embodiment, illustrating part of the configuration thereof.
Figure 6B:
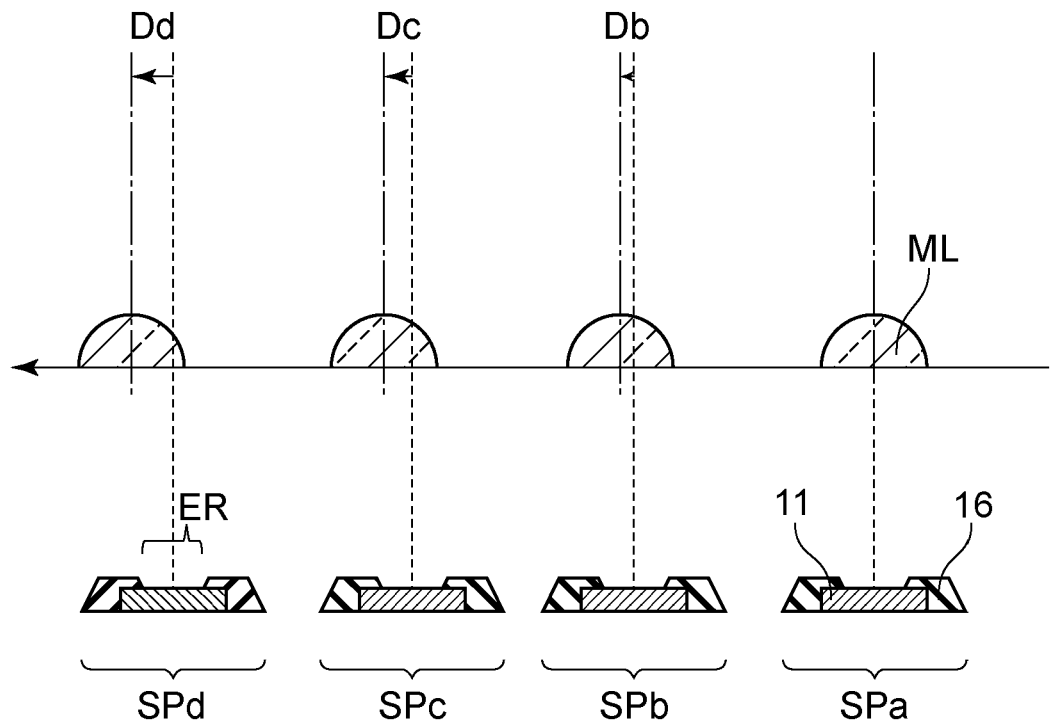
FIG. 6B is a schematic cross-sectional view of the display apparatus according to the first embodiment, illustrating part of the configuration thereof.
Figure 7:
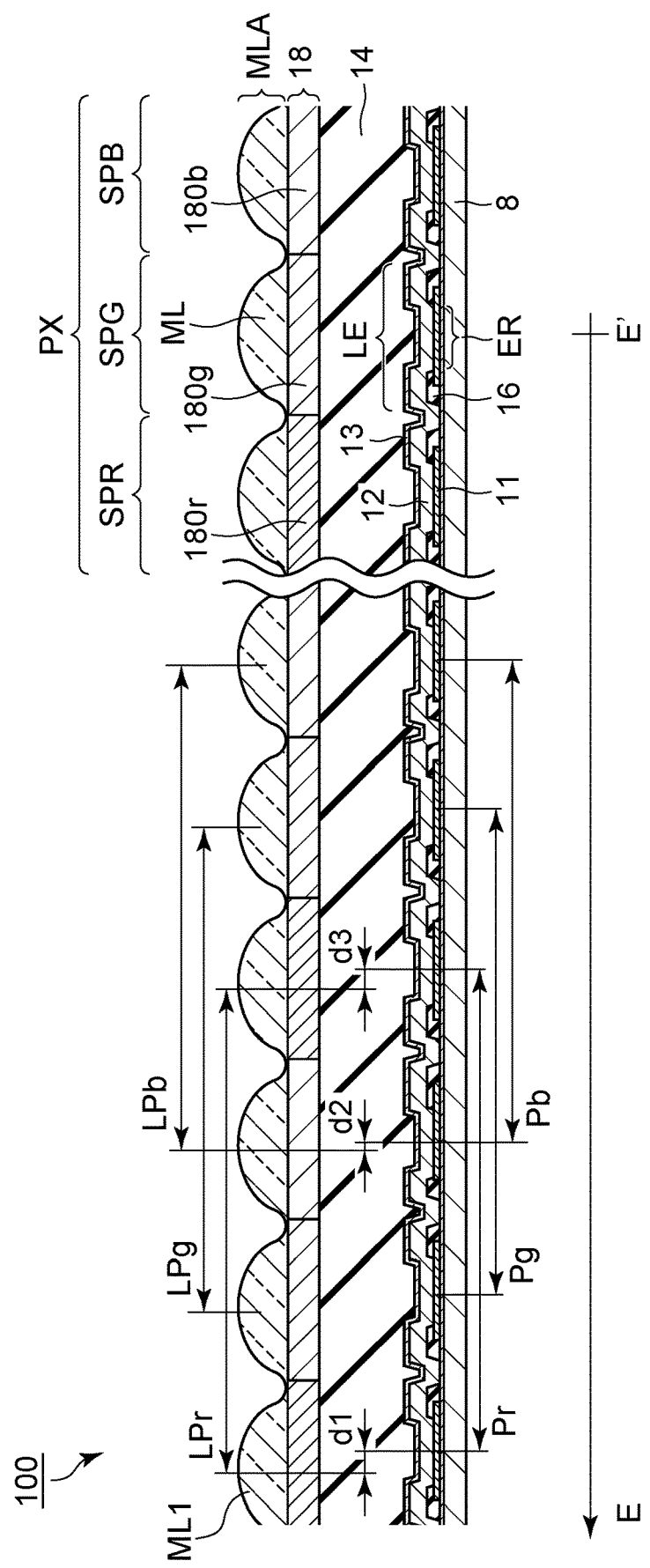
FIG. 7 is a schematic cross-sectional view of part of the cross section taken along line VII-VII in FIG. 6A.

FIG. 6A is a plan view of some of the plurality of sub-pixels SP disposed in the display area 110 of the display apparatus 100. FIG. 6B is a schematic cross-sectional view of some of the sub-pixels SP in the cross section taken along line VIB-VIB in FIG. 6A. FIG. 7 is a schematic cross-sectional view of part of the cross section taken along line VII-VII in FIG. 6A.

As shown in FIG. 7, each of the plurality of sub-pixels SP of the display apparatus 100 includes a light emitting element LE. Each light emitting element LE includes a first electrode 11, an insulating layer 16 covering the end of the first electrode 11, an organic layer 12 including a light emitting layer, and a second electrode 13 disposed above the first electrode 11 with the organic layer 12 therebetween, which are independently provided for each light emitting element LE. The first electrode 11 is also referred to as "lower electrode", "pixel electrode", or "individual electrode".

The organic layer 12 is disposed continuously on the first electrode 11 and the insulating layer 16 in common to the plurality of light emitting elements LE. In other words, a single organic layer 12 is shared by the plurality of light emitting elements LE. The organic layer 12 may be disposed in common over the plurality of sub-pixels SP constituting a single pixel PX. The organic layer 12 may be separated between adjacent pixels PX or may be disposed in common over a plurality of pixels PX. The organic layer 12 may be formed integrally over the whole display area 110. If the organic layer 12 is constituted by a plurality of layers, at least some of the layers may be disposed continuously over the plurality of light emitting elements LE. In this case, at least the light emitting layer may be disposed continuously over the plurality of light emitting elements LE. The light emitting layer may be disposed continuously from the top of a first lower electrode, which is the lower electrode of the first sub-pixel SP1, to the top of a second lower electrode, which is the lower electrode of the second sub-pixel SP2. If the sub-pixel SP is minute in size, the light emitting layer may be disposed in common over the plurality of sub-pixels SP. The words "disposed continuously" refers to "disposed without disconnection".

The insulating layer 16 has an opening on the first electrode 11. The first electrode 11 and the organic layer 12 are in contact at the opening, above which the second electrode 13, which is an upper electrode, is disposed. In other words, the first electrode 11, the organic layer 12 including the light emitting layer, and the second electrode 13 are layered in the opening of the insulating layer 16. The light emitting element LE emits light in the area in which the first electrode 11 and the organic layer 12 are in contact. Accordingly, the area in which the first electrode 11 and the organic layer 12 are in contact serves as the light emitting area ER of the light emitting element LE. In this embodiment, the area in which the first electrode 11 and the organic layer 12 are in contact is defined by the opening of the insulating layer 16, and therefore the light emitting area ER of the light emitting element LE is defined by the opening of the insulating layer 16. The insulating layer 16 is also referred to as a pixel separation film, a partition, or a bank.

The display apparatus 100 further includes a protective layer 14 disposed on the second electrode 13, a color filter layer 18 disposed on the protective layer 14, and a microlens array MLA disposed on the color filter layer 18. The microlens array MLA includes a plurality of microlenses ML corresponding to the individual light emitting elements LE. Each of the microlenses ML is disposed on the light emitting area ER of a corresponding light emitting element LE so as to be aligned with the light emitting area ER of the corresponding light emitting element LE in plan view seen from the direction perpendicular to the main surface of the substrate 8. Each of the microlenses ML may be disposed directly above the light emitting area ER of the corresponding light emitting element LE. Each of the microlenses ML may be disposed so as to be aligned with the center of the light emitting area ER of the corresponding light emitting element LE in plan view from the direction perpendicular to the main surface of the substrate 8. Each microlens ML receives the light emitted from the corresponding light emitting element LE. In this embodiment, the microlens ML receives light emitted from the light emitting element LE and passing through the color filter 180.

<Increasing Emission Intensity by Displacing Microlens>

In this embodiment, the microlenses ML at the center of the display area 110 are each disposed without displacement from the light emitting area ER. The displacement between the microlens ML and the light emitting area ER is the displacement between the apex of the microlens ML and the center of the light emitting area ER. In the following description, the displacement between the apex of the microlens ML and the center of the light emitting area ER is sometimes simply referred to as the displacement between the microlens ML and the light emitting area ER. At the center of the display area 110, the distance between the apex of the microlens ML and the center of the light emitting area ER is substantially zero in plan view facing the surface (main surface) of the substrate 8 on which the light emitting element LE is disposed, except a production error.

In contrast, on the periphery of the display area 110, each microlens ML is disposed closer to the periphery of the display area 110 with respect to the light emitting area ER. In other words, on the periphery of the display area 110, the apex of the microlens ML and the center of the light emitting area ER are spaced apart (not aligned) in plan view facing the surface (main surface) of the substrate 8 on which the light emitting element LE is disposed. Furthermore, in this embodiment, the distance between the apex of the microlens ML and the center of the light emitting area ER is larger as the sub-pixel SP is located closer to the periphery of the display area 110, as shown in FIG. 6B.

FIG. 6B illustrates four sub-pixels SPa to SPd. The sub-pixel SPa is located at the center of the display area 110. The sub-pixel SPb is located closer to the periphery of the display area 110 than the sub-pixel SPa. The sub-pixel SPc is located closer to the periphery of the display area 110 than the sub-pixel SPb. The sub-pixel SPd is located closer to the periphery of the display area 110 than the sub-pixel SPc. In this case, db<Dc<Dd holds, where db, Dc, and Dd are the respective distances between the apexes of the microlenses ML and the centers of the light emitting areas ER of the sub-pixels SPb, SPc, and SPd.

As shown in FIG. 6B, the direction from the center of the light emitting area ER to the apex of the microlens ML in the direction parallel to the main surface of the substrate 8 is the direction from the center of the display area 110 toward the periphery. Although FIG. 6B illustrates only some of the sub-pixels SP arranged along line segment VIB-VIB in FIG. 6B, the above configuration applies also to the other sub-pixels SP arranged along the other line segments passing through the center of the display area 110. In other words, the direction from the center of the light emitting area ER in each sub-pixel SP to the apex of the microlens ML in the direction parallel to the main surface of the substrate 8 is the direction from the center of the display area 110 toward the periphery. In other words, the display apparatus 100 of this embodiment includes a plurality of sets of the light emitting area ER and the microlens ML that receives the light from the light emitting area ER. In the plurality of sets, the direction from the center of the light emitting area ER to the apex of the microlens ML in the direction parallel to the main surface of the substrate 8 is the direction from the center of the display area 110 in which the plurality of sets is disposed toward the periphery. In other words, the microlens ML in each sub-pixel SP is radially displaced about the center of the display area 110 from the light emitting area ER in plan view perpendicular to the main surface of the substrate 8.

In the case where the display apparatus 100 is used together with a magnifying optical system, as described above, the light emitted in the direction of the normal to the display surface (in the front direction) from the center of the display area 110 of the display apparatus 100 is incident on the user's eyeball. In contrast, on the periphery of the display area 110, the light emitted obliquely with respect to the display surface is incident on the user's eyeball. For this reason, displacing the microlens ML from the light emitting area ER on the periphery of the display area 110, as in this embodiment, increases the emission intensity of the light emitted obliquely from the sub-pixels SP on the periphery of the display area 110. This improves the light use efficiency of the display apparatus 100. The light use efficiency refers to the percentage of the amount of light incident on the user's eyeball of the light emitted from the display apparatus 100.

<Preventing Color Misregistration by Adjusting Microlens Displacement Amount>

In this embodiment, the displacement amount of the apex of the microlens ML from the center of the light emitting area ER is independently adjusted for each of the plurality of sub-pixels SP constituting one pixel PX. In this embodiment, the distance between the apex of the microlens ML and the center of the light emitting area ER are made different between two of the plurality of sub-pixels SP constituting one pixel PX. In this embodiment, the distance between the apex of the microlens ML and the center of the light emitting area ER are made different between two sub-pixels SP. Alternatively, not only the distance (absolute value) but also the direction may be individually set for the displacement. In other words, the displacement from the apex of the microlens ML to the center of the light emitting area ER may be made different between two of the plurality of sub-pixels SP constituting one pixel PX. In other words, the vector from the apex of the microlens ML to the center of the light emitting area ER may be made different between two of the sub-pixels SP constituting one pixel PX.

The microlenses ML are arrayed at a predetermined pitch by the kind of the sub-pixel SP. For the sub-pixels SPR, the microlenses ML are arrayed at a pitch LPr. For the sub-pixels SPG, the microlenses ML are arrayed at a pitch LPg. For the sub-pixels SPB, the microlenses ML are arrayed at a pitch LPb. The pitch of the microlenses ML is the distance between the apexes of microlenses ML corresponding to the closest sub-pixels of sub-pixels SB that emit the same color light in plan view facing a surface (main surface) of the substrate 8 on which the light emitting element LE is disposed.

In this embodiment, the pitch of the microlenses ML is constant regardless of the emission color (the kind of the sub-pixel SP), LPr=LPg=LPb, as shown in FIG. 7. The constant pitch of the microlenses ML allows the microlenses ML to be laid with a small gap. This allows for setting the radius of each microlens ML large, improving the light extraction efficiency.

Also the light emitting areas ER of the sub-pixels SP are arrayed at a predetermined pitch by the kind of sub-pixel SP. The light emitting areas ER of the sub-pixels SPR are arrayed at a pitch Pr. The light emitting areas ER of the sub-pixels SPG are arrayed at a pitch Pg. The light emitting areas ER of the sub-pixels SPB are arrayed at a pitch Pb. The pitch of the light emitting areas ER is the distance between the centers of the light emitting areas ER of the closest sub-pixels SP of sub-pixels that emit the same color light in plan view facing the surface (main surface) of the substrate 8 on which the light emitting element LE is disposed. In this embodiment, the pitch of the light emitting areas ER depends on the emission color (the kind of the sub-pixel SP). Specifically, Pr=Pg<Pb holds, as shown in FIG. 7.

In this embodiment, the pitch of the light emitting areas ER and the pitch of the microlenses ML differ (Pr<LPr, Pg<LPg, Pb<LPb). Specifically, Pr=Pg<Pb<LPr=LPg=LPb. Since the pitch of the microlenses ML and the pitch of the light emitting areas ER differ, the microlenses ML are displaced outward from the light emitting elements LE on the periphery although the microlenses ML and the light emitting elements LE in the center of the display area 110 are arranged without displacement. In other words, the microlenses ML are displaced from the light emitting areas ER leftward (in the direction from E' toward E) on the left periphery of the display area 110, shown in FIGS. 6A and 6B and FIG. 7. As shown in FIGS. 6A and 6B and FIG. 7, the apex of the microlens ML and the center of the light emitting area ER are aligned at the center E' of the display area 110. Thus, changing not the pitch of the microlenses ML but the pitch of the light emitting areas ER according to the kind of the sub-pixel SP allows for making the displacement of the apex of the microlens ML from the center of the light emitting area ER different between two sub-pixels SP of one pixel PX. Adjusting the displacement according to the kind of the sub-pixel SP (the color of emission light) allows adjusting the effect of increasing the intensity of light emitted in a specific direction by displacing the microlens ML from the light emitting area ER for each sub-pixel SP. This allows the intensity of the light to be used according to the position in the display area 110, in other words, the output angle of the light to be increased or decreased for each sub-pixel SP. This allows reducing color misregistration between the center and the periphery of the display area 110, thereby increasing the display quality.

In this embodiment, the sub-pixels SPR that emit the first color light and the sub-pixels SPG that emit the third color light are designed to increase the intensity of light emitted in the direction of the user's eyeball. In other words, for the sub-pixels SPR and the sub-pixels SPG, the pitches of the microlenses ML and the light emitting areas ER are set so as to increase the intensity of light emitted in a specific direction, which depends on the position of the sub-pixels SP in the display area 110. Typically, the lens displacement amount of each sub-pixel SP is set to maximize the intensity of light emitted from the sub-pixel SP in a specific direction. The sub-pixels SPB that emit the second color light are designed to relatively decrease the intensity of light emitted toward the user's eyeball on the periphery of the display area 110. In other words, for the sub-pixels SPB disposed on the periphery of the display area 110, the pitches of the microlenses ML and the light emitting areas ER are set so as to relatively decrease the intensity of light emitted in a specific direction that depends on the position of each sub-pixel SP in the display area 110.

The ratio of the emission intensity of the sub-pixels SPB that emit the second color light in oblique directions to that in the front direction is higher than the ratios of the other sub-pixels (SPR and SPG), as described above. For this reason, if the intensity of light emitted toward the user's eyeball is increased over the whole display areas 110 of all the sub-pixels SP, the color component ratio is deviated on the periphery, causing the intensity of the second color light to be higher than the light emitted in the front direction. For this reason, for a type of sub-pixels SP that emit light of higher intensity in the oblique directions than the light in the front direction, this embodiment with the above configuration decreases the emission intensity on the periphery of the display area 110, relative to the emission intensity of other types of sub-pixels SP. This allows also the pixels PX on the periphery of the display area 110 to have the same color component ratio as that of the pixels PX at the center of the display area 110, thereby reducing the color misregistration on the periphery.

For sub-pixels (in this case, the sub-pixels SPR and SPG) other than sub-pixels whose emission intensity on the periphery is to be decreased (in this case, the sub-pixel SPB), the intensity of light emitted from the sub-pixels in a specific direction is maximized. For sub-pixels (the sub-pixel SPB) whose emission intensity on the periphery is to be decreased, the lens displacement amount is made different from that of the other sub-pixels. More specifically, for the sub-pixel (the sub-pixel SPB) whose emission intensity on the periphery is to be decreased, the lens displacement amount is made smaller than the lens displacement amounts of the other sub-pixels. This allows the color misregistration on the periphery of the display area 110 to be reduced while increasing the light use efficiency of each sub-pixel SP.

The pitch of the microlenses ML may be 0.1 or more times and 20 or less times the pitch of the light emitting areas ER. Specifically, the pitch of the light emitting areas ER may be 0.1 μm or more and 120 μm or less, and the pitch of the microlenses ML may be 0.01 μm or more and 2,400 μm or less. In this embodiment, the distance from the second electrode 13 of the light emitting element LE to the microlens ML may be 0.1 μm or more and 1 mm or less. The distance from the light emitting area ER of the light emitting element LE to the microlens ML may be 0.1 μm or more and 1 mm or less.

Here, the pitch of the microlenses ML is not changed but the pitch of the light emitting areas ER is changed. Alternatively, the pitch of the microlenses ML may be changed without changing the pitch of the light emitting areas ER. Alternatively, both of the pitch of the microlenses ML and the pitch of the light emitting areas ER may be changed. In this case, the pitch of the microlenses ML and the pitch of the light emitting areas ER may be changed for at least one kind of sub-pixel SP. Here, the microlenses ML and the light emitting areas ER are arrayed at predetermined pitches for each kind of the sub-pixels SP. This is given for mere illustrative purposes. At least one of the microlenses ML and the light emitting areas ER of a specific kind of sub-pixel SP need not be arrayed at a regular pitch. In other words, for a specific type of sub-pixel SP, the distance between adjacent two microlenses ML or the distance between adjacent two light emitting areas ER need not be constant.

<Another Aspect of this Embodiment>

Next, another aspect of this embodiment will be described. In the following description, the microlens ML of a first sub-pixel SP1 is referred to as a first lens ML1, the microlens ML of a second sub-pixel SP2 is referred to as a second lens ML2, and the microlens ML of a third sub-pixel SP3 is referred to as a third lens ML3. The microlens ML of a fourth sub-pixel SP4 is referred to as a fourth lens ML4, the microlens ML of a fifth sub-pixel SP5 is referred to as a fifth lens ML5, and the microlens ML of a sixth sub-pixel SP6 is referred to as a sixth lens ML6. The light emitting element LE of the first sub-pixel SP1 is referred to as a first light emitting element LE1, and the light emitting area ER of the first light emitting element LE1 is referred to as a first light emitting area ER1. The light emitting element LE of the second sub-pixel SP2 is referred to as a second light emitting element LE2, and the light emitting area ER of the second light emitting element LE2 is referred to as a second light emitting area ER2. The light emitting element LE of the third sub-pixel SP3 is referred to as a third light emitting element LE3, and the light emitting area ER of the third light emitting element LE3 is referred to as a third light emitting area ER3. The light emitting element LE of the fourth sub-pixel SP4 is referred to as a fourth light emitting element LE4, and the light emitting area ER of the fourth light emitting element LE4 is referred to as a fourth light emitting area ER4. The light emitting element LE of the fifth sub-pixel SP5 is referred to as a fifth light emitting element LE5, and the light emitting area ER of the fifth light emitting element LE5 is referred to as a fifth light emitting area ER5. The light emitting element LE of the sixth sub-pixel SP6 is referred to as a sixth light emitting element LE6, and the light emitting area ER of the sixth light emitting element LE6 is referred to as a sixth light emitting area ER6.

Thus, in this embodiment, the displacement of the apex of the microlens ML from the center of the light emitting area ER of the light emitting element LE differs between two sub-pixels SP of the plurality of sub-pixels SP constituting one pixel PX. Accordingly, the displacement from the center of the first light emitting area ER1 to the apex of the first lens ML1 in plan view differs from the displacement from the center of the second light emitting area ER2 to the apex of the second lens ML2 in plan view. In other words, the vector from the center of the first light emitting area ER1 to the apex of the first lens ML1 in plan view differs from the vector from the center of the second light emitting area ER2 to the apex of the second lens ML2 in plan view.

<Another Aspect 1 of this Embodiment>

In focusing on the first sub-pixel SP1, the second sub-pixel SP2, and the third sub-pixel SP3, this embodiment is regarded as follows.

As shown in FIG. 7, the distance between the center of the first light emitting area ER1 and the apex of the first lens ML1 in plan view is referred to as a first distance d1, the distance between the center of the second light emitting area ER2 and the apex of the second lens ML2 in plan view is referred to as a second distance d2, and the distance between the center of the third light emitting area ER3 and the apex of the third lens ML3 is referred to as a third distance d3. The first distance d1 and the third distance d3 differ from each other (that is, d1≠d3). The difference (|d1−d2|) between the first distance d1 and the second distance d2 is larger than or equal to the distance (|d1−d3|) between the first distance d1 and the third distance d3. In other words, |d1−d2|≥|d1−d3| holds. The first distance d1 and the second distance d2 differ from each other (that is, d1≠d2).

In this embodiment, LPr=LPg=LPb and Pr=Pg<Pb, and the first pixel PX1 is disposed closer to the periphery of the display area 110 than the second pixel PX2. Therefore, d1>d2 holds. However, the present disclosure is not limited to this configuration. The lens displacement amount (in this example, d1) for the color light whose intensity in an oblique directions is to be relatively increased is set to an amount at which the emission intensity to a desired angle can be increased. Then, the lens displacement amount (in this example, d2) of the color light whose intensity in an oblique directions is to be relatively decreased is set to a different amount. For example, d1<d2 may be satisfied.

For sub-pixels that emit light of colors whose intensity in oblique directions is to be relatively increased, lens displacement amounts at which the emission intensity to desired angles become maximum may be set according to the positions of the sub-pixels in the display area 110. This improves the light use efficiency. Preferably, d1>d2 is satisfied. This allows d2 to be set smaller, achieving a simple design. The distance d2 may be zero. In other words, for sub-pixels other than the sub-pixels that emit light of colors whose intensity in the oblique directions is to be increased, the apex of each microlens ML need not be displaced from the center of each light emitting area ER.

<Another Aspect 2 of this Embodiment>

In focusing on the first sub-pixel SP1, the second sub-pixel SP2, the third sub-pixel SP3, and the fourth sub-pixel SP4, this embodiment can be regarded as follows.

In this embodiment, the pitch of the microlenses ML is constant regardless of the kind of the sub-pixel SP. Therefore, the distance between the apex of the first lens ML1 and the apex of the third lens ML3 is equal to the distance between the apex of the second lens ML2 and the apex of the fourth lens ML4 in plan view. In contrast, the pitch of the light emitting areas ER varies according to the kind of the sub-pixel SP. For this reason, the distance between the center of the first light emitting area ER1 and the center of the third light emitting area ER3 differs from the distance between the center of the second light emitting area ER2 and the center of the fourth light emitting area ER4 in plan view.

Other Embodiments

In this embodiment, the areas of the light emitting areas ER of the sub-pixels SP are constant over the entire display area 110 regardless of the kind of the sub-pixels SP. However, this is given for mere illustrative purposes. The area of the light emitting area ER may be varied from sub-pixel SP to another, for example, to adjust the amount of current necessary for emitting light with predetermined luminance. The area of the light emitting area ER may be changed according to the position of the sub-pixel 110 in the display area 110. For example, the areas of the light emitting areas ER of the sub-pixels SP disposed on the periphery of the display area 110 may be smaller than the areas of the light emitting areas ER of the sub-pixels SP disposed at the center of the display area 110.

<Detailed Description of Components of Sub-Pixel>

The substrate 8 may be any plate-like member that can support the first electrode 11, the organic layer 12, and the second electrode 13. The substrate 8 may be a semiconductor substrate, such as a silicon substrate, a conductive substrate, such as metal, or an insulator substrate, such as glass, quartz, or resin. A drive circuit layer (not shown) including a transistor electrically connected to the first electrode 11 may be formed on the substrate 8. In this embodiment, the drive circuit formed on the drive circuit layer is an active-matrix pixel drive circuit. In other words, the display apparatus 100 is an active-matrix display apparatus. The drive circuit layer may be laminated on the substrate 8, or part of the drive circuit layer may be formed directly at the substrate 8 by a semiconductor process. The drive circuit layer may be a multilayer interconnection layer including a transistor, multiple wiring layers, and an interlayer insulating layer disposed between the multiple wiring layers. If the substrate 8 includes the drive circuit layer, the drive circuit layer may also be regarded as "substrate". If the drive circuit layer is also regarded as "substrate", the upper surface of the uppermost interlayer insulating layer of the drive circuit layer can be regarded as the main surface of the substrate 8. Since in this embodiment the first electrode 11 is formed on the main surface, the lower surface of the first electrode 11 is aligned with the main surface of the substrate 8. For this reason, the lower surface of the first electrode 11 may be regarded as the main surface of the substrate 8.

The first electrode 11 is an anode (a positive electrode), which is electrically isolated by the insulating layer 16 for each sub-pixel SP. The first electrode 11 may be either transparent or opaque. If the first electrode 11 is opaque, a metal material with a reflectivity of 70% or more at an emission wavelength may be used. Example materials of the first electrode 11 include metal, such as aluminum (Al) or silver (Ag), alloys of Al or Ag and silicon (Si), copper (Cu), nickel (Ni), or neodymium (Nd), and transparent conducting oxides, such as indium tin oxide (ITO), indium zinc oxide (IZO), aluminum-doped zinc oxide (AZO), and indium gallium zinc oxide (IGZO). The emission wavelength refers to the spectrum range of the light emitted from the organic layer 12. If the first electrode 11 has a reflectivity higher than the desired reflectivity, a barrier electrode made of titanium (Ti), tungsten (W), molybdenum (Mo), gold (Au) or an alloy thereof or a transparent oxide film electrode, such as ITO or IZO may be laminated thereon.

If the first electrode 11 is a transparent electrode, a reflecting layer may be provided under the first electrode 11. Examples of the transparent electrode include transparent conductive oxides, such as ITO, IZO, AZO, and IGZO. An insulating layer may be provided between the reflecting layer and the transparent conductive film to optimize the optical path length, described later.

The second electrode 13 is disposed on the organic layer 12 and has light transmittance. The second electrode 13 may be made of a semi-transmissive material having the property of transmitting part of light that has reached the surface thereof and reflecting other part (that is, semitransparent reflective properties).

The second electrode 13 may be made of a transparent material, for example, the transparent conductive oxides described above. Other examples include semitransparent materials, such as simple metal including aluminum, silver, and gold, alkali metal including lithium and cesium, alkali earth metal including magnesium, calcium, and barium, and alloys containing such metal materials. The semitransparent material may be an alloy mainly containing magnesium or silver. The second electrode 13 may have any laminate structure of layers of the above materials having a desired transmittance. The second electrode 13 may be shared by a plurality of light emitting elements LE.

One of the first electrode 11 and the second electrode 13 functions as a positive electrode, and the other functions as a negative electrode. In other words, the first electrode 11 may be a positive electrode, the second electrode 13 may be a negative electrode, and vice versa. When an electric field is applied in the direction in which the light emitting element LE emits light, a potential electrode having a higher potential is the positive electrode, and the other is the negative electrode. In other words, an electrode that supplies holes to the light emitting layer is the positive electrode, and an electrode that supplies electrons is the negative electrode.

The organic layer 12 is disposed on the first electrode 11 and can be formed by a known technique, such as an evaporation method or a spin coat method. The organic layer 12 may be constituted by a plurality of layers.

If the organic layer is an organic compound layer, the plurality of layers is one or a combination of a hole-injection layer, a hole transport layer, an electron block layer, a light emitting layer, a hole block layer, an electron transport layer, and an electron injection layer.

The light emitting layer emits light by recombination of holes injected from the positive electrode and electrons injected from the negative electrode in the organic compound layer. The light emitting layer may be either a single layer or a multilayer. The light emitting layer may have a layer of a red light emitting material, a green light emitting material, or a blue light emitting material. Mixing the colors allows forming white light. The light emitting layer may have layers of light emitting materials of complementary colors, such as a blue light emitting material and a yellow light emitting material.

Different color light may be omitted by changing the material contained in the light emitting layer or the configuration for each sub-pixel. Each of the light emitting elements LE may include the light emitting layer. In this case, the light emitting layer may be patterned for each light emitting element LE.

The display apparatus according to this embodiment may include a device including a first reflecting surface, a second reflecting surface, and a light emitting layer disposed between the first reflecting surface and the second reflecting surface. The above light emitting element LE may have this configuration. The first reflecting surface may be either the first electrode 11 or a reflecting layer disposed between the first electrode 11 and the insulating layer 16.

The optical path length Lr from the light emitting position of the organic layer 12 from the upper surface of the first reflecting surface for optimizing the optical path length between the first reflecting surface and the light emitting position of the organic layer 12 including a light emitting layer is expressed as Eq. 3:

$$Lr=(2m-(\phi r/\pi))\times(\lambda/4) \qquad \text{Eq. 3}$$

where ϕr is the phase shift at the reflecting layer, and m is an integer greater than or equal to 0. The film thickness of the first electrode 11 or the first reflecting surface, and the organic layer 12 may be optimized to roughly satisfy Eq. 3.

The optical path length Ls from the emission position to the second reflecting surface roughly satisfies Eq. 4:

$$Ls=(2m'-(\phi s/\pi))\times(\lambda/4)=-(\phi s/\pi)\times(\lambda/4) \qquad \text{Eq. 4}$$

where ϕs is the phase shift of light with a wavelength of λ when reflected on the reflecting surface. In this embodiment, m'=0.

Therefore, full-thickness interference L roughly satisfies the following condition:

$$L=Lr+L=(2m-\phi/\pi)\times(\lambda/4) \qquad \text{Eq. 5}$$

where ϕ is the sum, ϕr+ϕs, of the phase shift when the light of wavelength λ is reflected by the first electrode 11 or the reflecting layer and the second electrode 13.

The words "roughly satisfy" indicates that the acceptable range in Eq. 3 to Eq. 5 is about λ/8 or 20 nm.

The emission position of the light emitting layer is sometimes difficult to specify. For this reason, the emission position is substituted by the interface of the functional layer adjacent to the first reflecting surface or the interface adjacent to the second reflecting surface is used in the above configuration. This substitution also provides the effect of increasing the light intensity in consideration of the above acceptable range.

The protective layer 14 may be a light-transmissive insulating layer containing an inorganic material with low external oxygen- and light-transmissivity. For example, the protective layer 14 can be made of an inorganic material, such as silicon nitride (SiN), silicon oxynitride (SiON), silicon oxide ($SiO_x$), aluminum oxide ($Al_2O_3$), or titanium oxide ($TiO_2$). In the viewpoint of protection performance, inorganic materials, such as SiN, SiON, $Al_2O_3$ may be used. The protective layer 14 may be formed using a chemical vapor deposition method (CVD), an atomic layer deposition method (ALD), or a sputtering method.

The protective layer 14 may have any single layer structure or a multilayer structure in which the above materials or the forming methods are combined having a sufficient water blocking performance. An example is a lamination of a silicon nitride layer and a high-density layer formed by an atom deposition method. The protective layer 14, if it has a water blocking performance, may include an organic layer. Examples of the organic layer include polyacrylate, polyimide, polyester, and epoxy. The protective layer 14 may be disposed over a plurality of light emitting elements LE.

The microlens array MLA may be formed by exposing and developing processes. Specifically, a film (photoresist film) is formed with a material for forming microlenses ML and is then exposed to light and subjected to development using a mask having a continuous gradation change. Examples of the mask include a gray mask and an area gradation mask that allows light irradiation with continuous gradation on an imaging plane by changing the density distribution of dots formed of a light shielding film with a resolution lower than or equal to the resolution of the exposure device.

The shape of the microlenses ML formed by the exposing and developing processes can be adjusted by etching back. The microlenses ML may have any shape that refracts radiated light, for example, a spherical shape or an asymmetric shape in cross section.

A light transmissive plate (not shown) may be disposed above the microlens array MLA with an air gap therebetween. The air gap may be a vacuum space or a space that contains gas. The air gap may be a space filled with air. Providing the air gap on the microlens array MLA allows the opposite side of the microlens array MLA from the light emitting element LE, that is, the light emission surface, to be filled with a material with a refractive index lower than that of the microlenses ML constituting the microlens array MLA. This increases the light collecting effect of the microlenses ML.

In this embodiment, light of different colors may be emitted from the individual light emitting elements LE to allow full-color display. Examples of a method for full-color display include a method using a white organic EL device and color filters and a method of emitting light of different colors by patterning the light emitting layer of each light emitting element LE.

The full-color display may be enabled by changing the distance between the first reflecting surface and the second reflecting surface for each light emitting element LE. The configuration in which the distance between the first reflecting surface and the second reflecting surface is changed allows the light emitting elements LE to emit light of different colors while sharing the light emitting layer, which makes it easier to manufacture the light emitting layer than a method of patterning the light emitting layer.

Figure 8A:
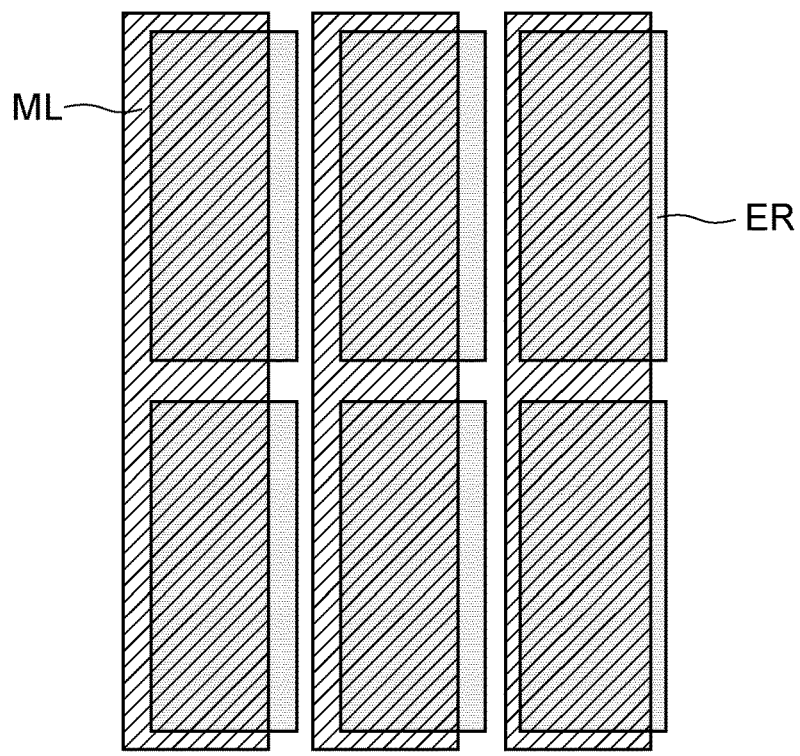
FIG. 8A is a schematic plan view of light emitting areas and microlenses illustrating an example of the arrangement.
Figure 8B:
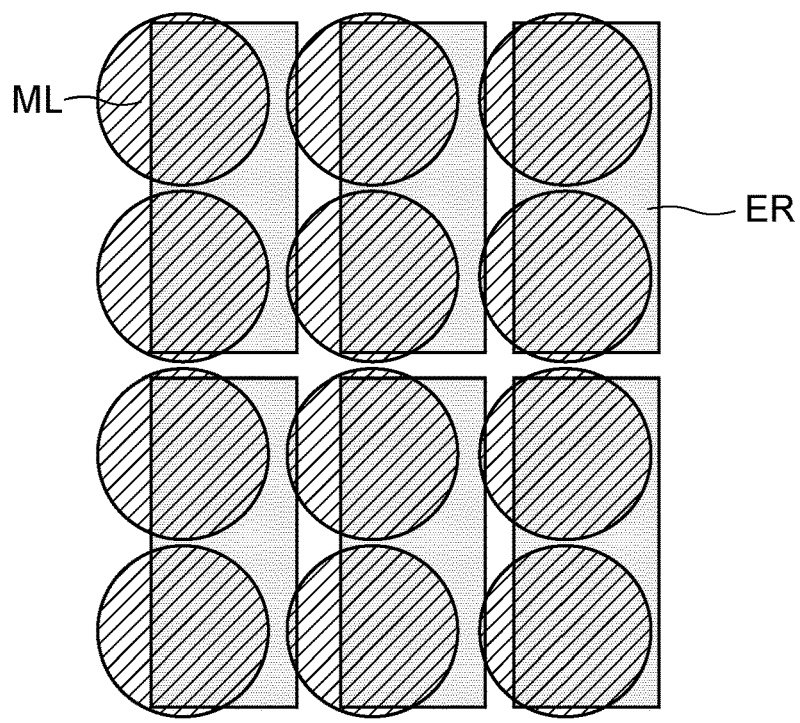
FIG. 8B is a schematic plan view of light emitting areas and microlenses illustrating an example of the arrangement.

The planar arrangement of a plurality of light emitting elements LE may be any of a stripe arrangement, a square arrangement, a delta arrangement, a PenTile arrangement, and a Bayer arrangement. FIGS. 5 to 7 illustrate an example of the delta arrangement. The size and shape of the microlenses ML may be set as appropriate according to the arrangement type. In the case of the stripe arrangement, long microlenses ML may be disposed over a plurality of sub-pixels, as shown in FIG. 8A. Alternatively, a plurality of semispherical microlenses ML may be arranged in one sub-pixel, as shown in FIG. 8B. In the case of spherical microlenses, the delta arrangement increases the area in which the light emitting area and the microlenses overlap, thereby increasing the light extraction efficiency.

In this embodiment, the color filter layer 18 may be disposed on the protective layer 14. Color filters 180r, 180b, and 180g included in the color filter layer 18 may be color filters that allow light of different colors to pass through. The sub-pixel SPR that emits the first color light includes the color filter 180r. The sub-pixel SPB that emits the second color light includes the color filter 180b. The sub-pixel SPG that emits the third color light includes the color filter 180g. The color filters 180r, 180b, and 180g may be color filters that allow, for example, red, blue, and green light to pass through, respectively. In FIG. 7, the color filter layer 18 is disposed between the protective layer 14 and the microlens array MLA.

FIG. 7 illustrates only sub-pixels SP in each of which the microlens ML is aligned with the center of the light emitting area ER of the display area 110 in plan view, but some embodiments are not limited to the above configuration. Only sub-pixels SP in each of which the microlens ML is aligned with the center of the light emitting area ER in plan view may be disposed over the whole display area 110. Alternatively, sub-pixels SP in each of which the microlens ML corresponding to one sub-pixel is not aligned with the center of the light emitting area ER of the sub-pixel in plan view may be arranged on the periphery of the display area 110. This configuration improves the light use efficiency in using the light radiated at larger angles with respect to the front direction on the periphery.

The embodiment shows an example of full-color display using color filters that allow light of three colors to pass through. Alternatively, part or the whole of the color filter layer 18 may be omitted. In this case, color display may be performed by dividing the light emitting layer by the light emitting elements LE so as to emit different colors of light from the light emitting elements LE.

The microlens array MLA may be integrally (continuously) formed directly on the protective layer 14. A planarizing layer may be formed between the protective layer 14 and the microlens array MLA to planarize the unevenness of the protective layer 14. The planarizing layer may be disposed on and under the color filter layer 18 and may be made of the same material or different materials. Specific examples include a polyvinyl carbazole resin, a polycarbonate resin, a polyester resin, an acrylonitrile-butadiene-styrene (ABS) resin, an acrylic resin, a polyimide resin, a phenol resin, an epoxy resin, a silicon resin, and a urea resin.

Integral structure of the microlens array MLA and the protective layer 14 allows the distance between the microlens ML and the corresponding light emitting element LE to be shorter than the distance when they are formed on different substrates and then bonded. This increases the solid angle of the light emitted from the light emitting layer onto the microlens MS, improving the light extraction efficiency.

The order of lamination of the color filter layer 18 and the microlens array MLA may be selected as appropriate.

In other words, the color filter layer 18 may be disposed on the microlens array MLA or between the microlens array MLA and the light emitting elements LE. FIG. 7 illustrates an example in which the microlens array MLA is disposed closer to the light extraction side than the color filter layer 18. The lamination of this order causes only the light that has passed through the color filter to enter the microlenses MS. This prevents emission to the light emitting elements LE of adjacent sub-pixels SP of unintended color light, improving the display quality.

The distance (color filter displacement amount) between the center of the color filter 180 of each sub-pixel SP and the center of the light emitting area ER in plan view can be set as appropriate. In the viewpoint of an optical path of the light from the light emitting area ER to the microlens ML through the color filter 180, the color filter displacement amount is preferably set within the range from 0 or more to a microlens displacement amount or less not to interfere with light transmission, as shown in FIG. 7.

The color filter layer 18 may be integrally formed on the protective layer 14, and also the microlens array MLA may be integrally formed, as shown in FIG. 7. Alternatively, the color filter layer 18 may be formed on a different substrate, and the substrate on which the color filter layer 18 is formed may be bonded to the substrate 8 so as to face each other. Integrally forming the color filter layer 18 and the protective layer 14 allows forming each color filter 180 relative to the light emitting area ER with positional accuracy using a photolithography process. Integrally forming the color filter layer 18, the microlens array MLA, and the protective layer 14 allows forming the light emitting area ER, the color filter 180, and the microlens ML with high positional relationship.

As shown in FIG. 9A, the microlens array MLA and the color filter layer 18 may be formed on different substrates, and they may be bonded to the substrate 8 including the light emitting elements LE to produce a display apparatus 101. This configuration increases the flexibility of the processing method (for example, temperature) for producing the color filter layer 18 and the microlens array MLA, thereby increasing the flexibility in designing and producing the color filter layer 18 and the microlens array MLA.

In this case, for example, the microlens array MLA and the color filter layer 18 are fixed to the substrate 8 with an adhesive. At that time, the adhesive may be applied either between the protective layer 14 and the microlens array MLA or between the planarizing layer and the microlens array MLA. Alternatively, a space may be provided between the microlens array MLA and the protective layer 14 (or the planarizing layer or the color filter), and the microlens array MLA may be fixed to the substrate 8 with an adhesive at an end of the display apparatus, or the space may be filled with resin. The refractive index of the filling resin may be smaller than the refractive index of the microlenses ML.

As shown in FIG. 9B, the color filter layer 18 may be integrally formed on the protective layer 14, and the microlens array MLA formed on another substrate may be bonded so as to face the color filter layer 18.

Figure 10:
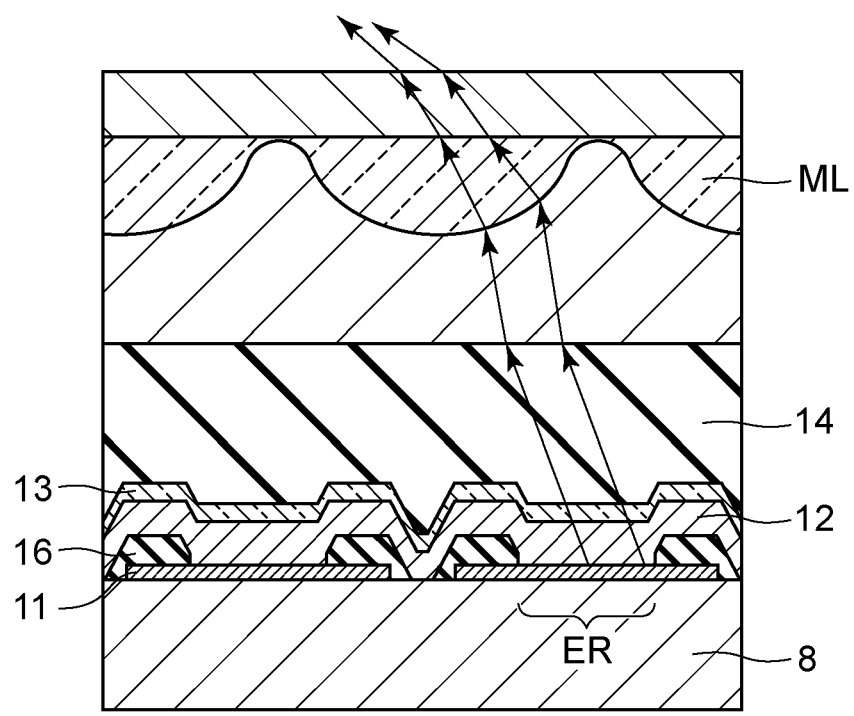
FIG. 10 is a cross-sectional view of a display apparatus illustrating the relationship between the arrangement of a light emitting area and a microlens and the light.

Also the configuration in which the microlens array MLA formed on a different substrate is bonded to the substrate 8 so as to face the substrate 8 gives the advantageous effects of the present disclosure. As shown in FIG. 10, displacing the apex of the microlens ML from the center of the light emitting area ER allows the light to be refracted when passing through the microlens ML.

Figure 11:
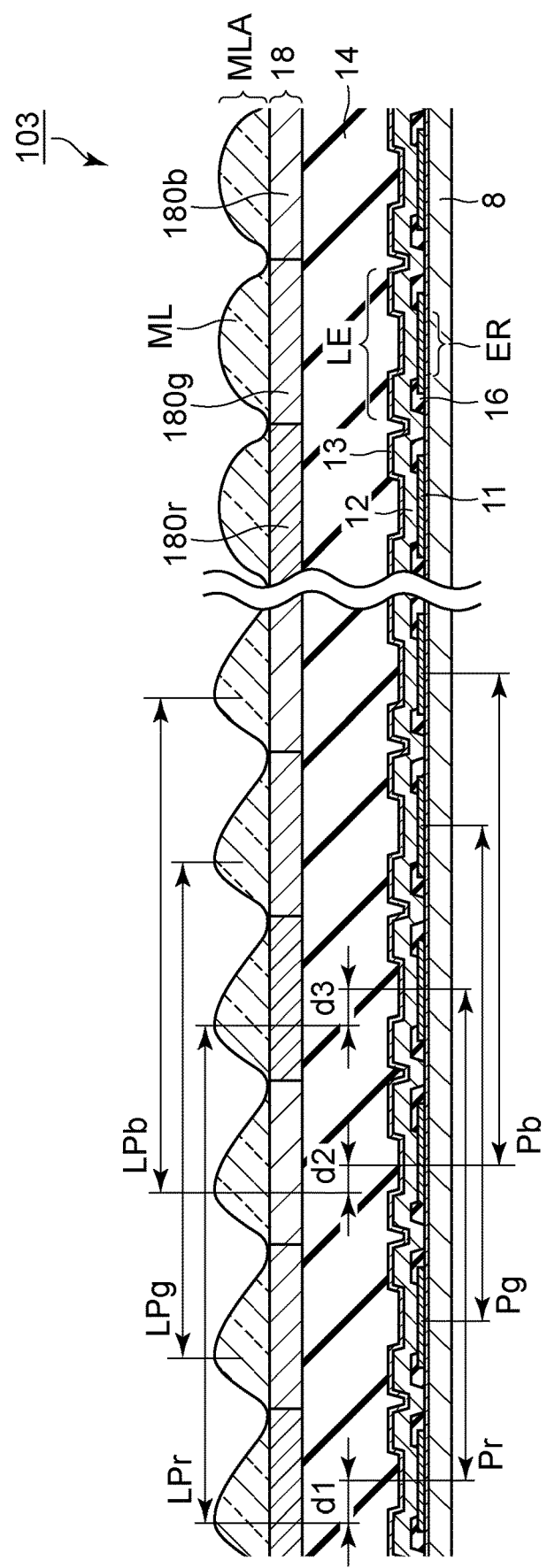
FIG. 11 is a schematic cross-sectional view of a modification of the display apparatus according to the first embodiment, illustrating the configuration thereof.

Although this embodiment describes an example in which the microlens ML is a spherical microlens, the display apparatus of this embodiment is not limited to this example. For example, as shown in FIG. 11, an aspherical lens in which the center (the center of gravity of a shape formed by lines connecting the ends of the lens in plan view) and the apex are not aligned may be used. Also in this case, the apex of the microlens ML, which is an aspherical lens, and the center of the light emitting area ER need only be out of alignment. The center of the aspherical microlens ML and the center of the light emitting area ER may either be out of alignment or in alignment.

FIG. 11 illustrates an example in which the microlenses ML of the sub-pixels SP disposed at the center E' of the display area 110 of a display apparatus 103 are spherical lenses, and the microlenses ML of the sub-pixels SP arranged on the periphery of the display area 110 are aspheric lenses. Also in this case, adjusting the lens displacement amount for each sub-pixel SP allows adjusting the emission intensity of light to a specific angle for each sub-pixel SP. This reduces the color misregistration between the center and the periphery of the display area 110, thereby improving the display quality.

Second Embodiment

Figure 12:
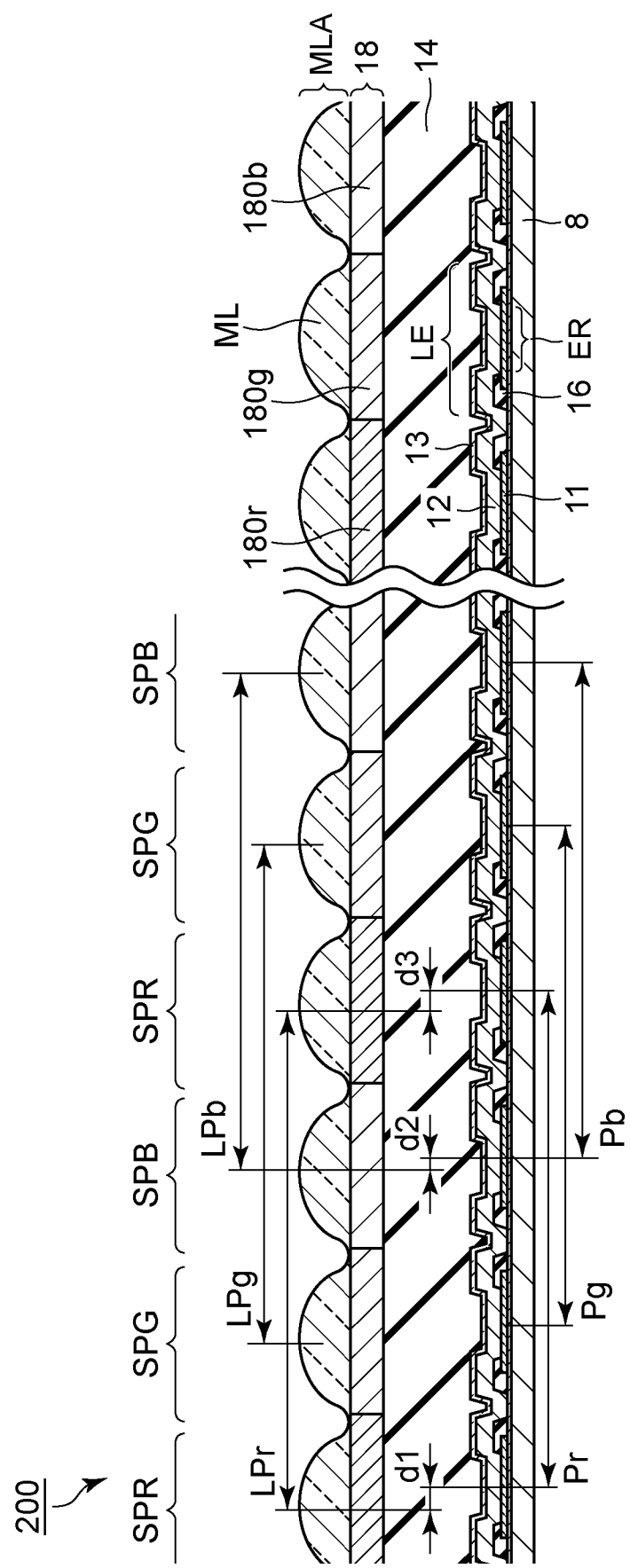
FIG. 12 is a schematic cross-sectional view of a display apparatus according to a second embodiment, illustrating the configuration thereof.

Referring to FIG. 12, a display apparatus according to a second embodiment of the present disclosure will be described. The difference from the first embodiment will be mainly described.

FIG. 12 is a cross-sectional view of the display apparatus 200 according to the second embodiment illustrating the configuration thereof. The difference from the display apparatus 100 is that the pitch of the light emitting areas ER is constant regardless of the emission color (the kind of the sub-pixel SP), and the pitch of the microlenses ML varies depending on the emission color (the kind of the sub-pixel SP). The others are the same as those of the display apparatus 100, and descriptions thereof will be omitted. Setting the pitch of the light emitting areas ER constant regardless of the kind of the sub-pixel SP, as in this embodiment, simplifies the design of the light emitting areas ER.

As shown in FIG. 12, for the sub-pixels SPR, the microlenses ML are arranged at a pitch LPr, for the sub-pixels SPG, the microlenses ML are arranged at a pitch LPg, and for the sub-pixels SPB, the microlenses ML are arranged at a pitch LPb. FIG. 12 illustrates an example in which LPb<LPr=LPg. The light emitting areas ER of the sub-pixels SPR are arranged at a pitch Pr, the light emitting areas ER of the sub-pixels SPG are arranged at a pitch Pg, and the light emitting areas ER of the sub-pixels SPB are arranged at a pitch Pb. FIG. 12 illustrates an example in which Pr=Pg=Pb. FIG. 12 also illustrates an example in which Pr=Pg=Pb<LPb<LPg=LPr.

Also this embodiment allows the lens displacement amount to be adjusted for each sub-pixel SP as in the first embodiment, thereby adjusting the effect of increasing the intensity of light emitted in a specific direction by displacing the microlens ML with respect to the light emitting area ER for each sub-pixel SP. This allows increasing or decreasing the intensity of the light to be used according to the position in the display area 110, that is, according to the output angle for each sub-pixel SP. This reduces the color misregistration between the center and the periphery of the display area 110, thereby improving the display quality.

Other Embodiments

Figure 13:
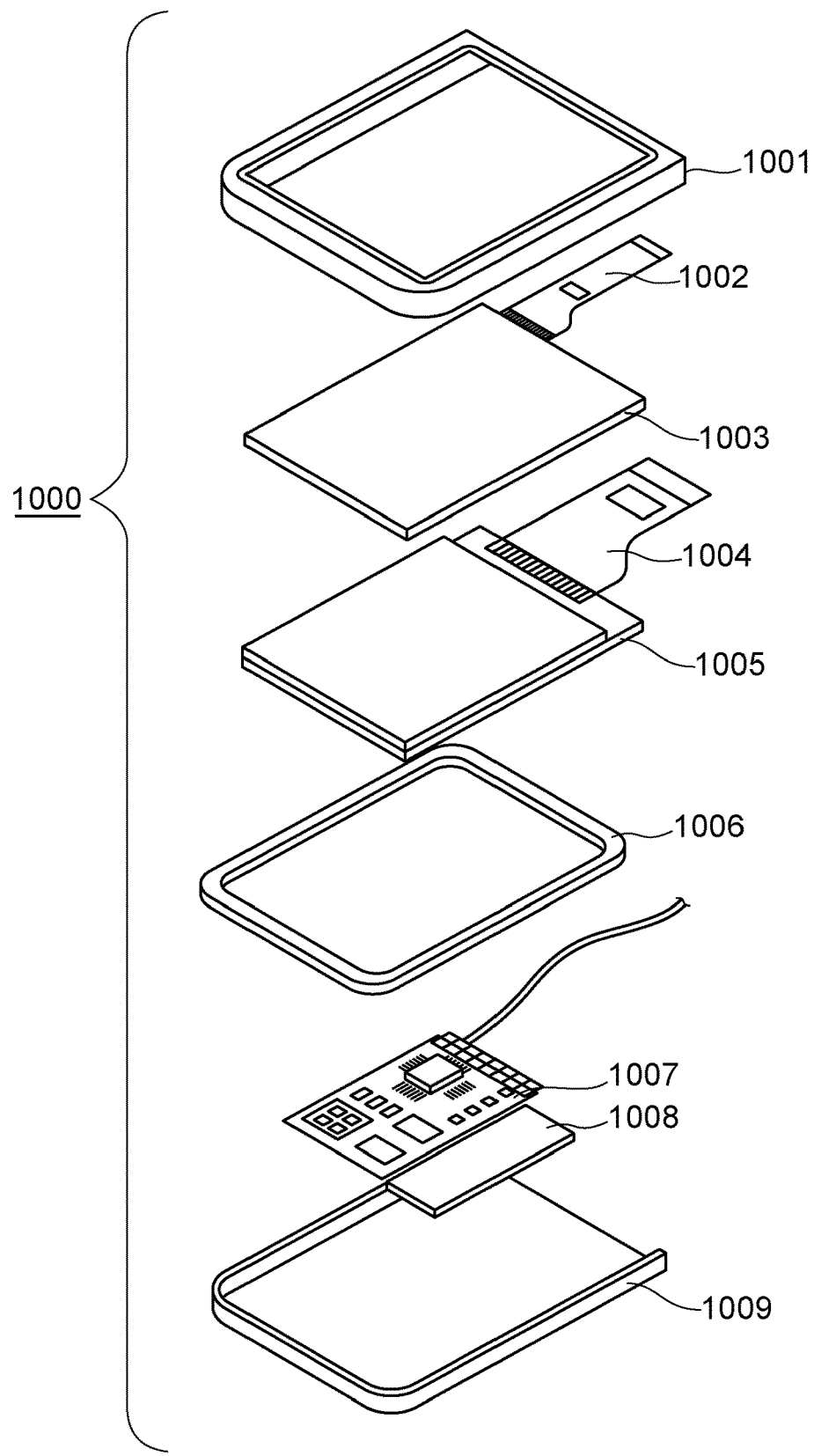
FIG. 13 is a schematic diagram illustrating an example of the display apparatus.

FIG. 13 is a schematic diagram illustrating an example of a display apparatus according to an embodiment. The display apparatus 1000 may include a touch panel 1003, a display panel 1005, a frame 1006, a circuit board 1007, and a battery 1008 between an upper cover 1001 and a lower cover 1009. Flexible printed circuits (FPCs) 1002 and 1004 are connected to the touch panel 1003 and the display panel 1005, respectively. Transistors are printed on the circuit board 1007. If the display apparatus is not a mobile device, the battery 1008 is not necessary, and if the display apparatus is a mobile device, the battery 1008 may be provided at a separate location.

The display apparatus 1000 according to this embodiment may include red, green, and blue color filters. The red, green, and blue color filters may be arranged in a delta arrangement.

The display apparatus 1000 according to this embodiment may be used as the display of a mobile terminal. In this case, the display apparatus 1000 may include both of a display function and an operating function. Examples of the mobile terminal include a mobile phone, such as a smartphone, a tablet, and a head mount display.

The display apparatus 1000 according to this embodiment may be used as the display of an image capturing apparatus including an optical unit including a plurality of lenses and an image sensor that receives light passing through the optical unit. The image capturing apparatus may include a display that displays information obtained by the image sensor. The display may be either a display exposed out of the image capturing apparatus or a display disposed in the finder. The image capturing apparatus may be a digital camera or a digital video camera.

Figure 14A:
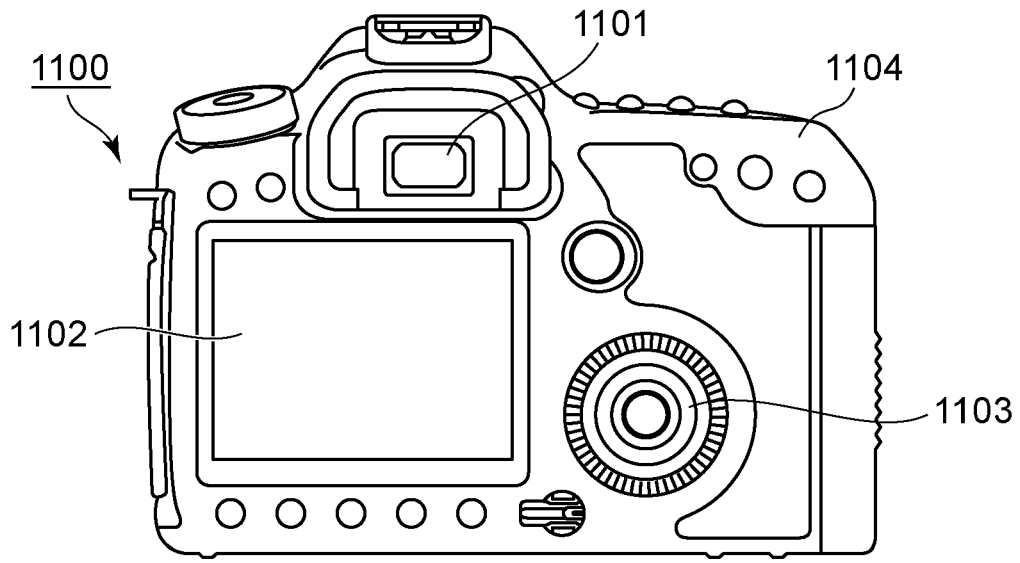
FIG. 14A is a schematic diagram illustrating an example of an image capturing apparatus.

FIG. 14A is a schematic diagram illustrating an example of the image capturing apparatus according to this embodiment. The image capturing apparatus 1100 may include a viewfinder 1101, a back display 1102, an operating unit 1103, and a casing 1104. The viewfinder 1101 may include the display apparatus 1000 according to this embodiment. In this case, the display apparatus 1000 may display not only a captured image but also environmental information, instructions for image capturing, and so on. The environmental information may include the intensity of outside light, the direction of outside light, the moving speed of the subject, and a possibility that the subject may be blocked by a shield.

Since the timing suitable for image capturing is minute, the information may be displayed as soon as possible. For this reason, a display apparatus including the organic light emitting element according to an embodiment of the present disclosure may be used. This is because the response speed of the organic light emitting element is high. The display apparatus including the organic light emitting element can be used more suitably for apparatuses that require high display speed than liquid crystal display apparatuses.

The image capturing apparatus 1100 includes an optical unit (not shown). The optical unit includes a plurality of lenses and forms an image on an image sensor housed in the casing 1104. The plurality of lenses can adjust the focus by adjusting their relative positions. This operation can also be performed automatically. The image capturing apparatus may also be referred to as a photoelectric conversion apparatus. The photoelectric conversion apparatus need not necessarily capture images one after another but may include a method of detecting the difference from the preceding image and a method of extracting images from recorded images.

Figure 14B:
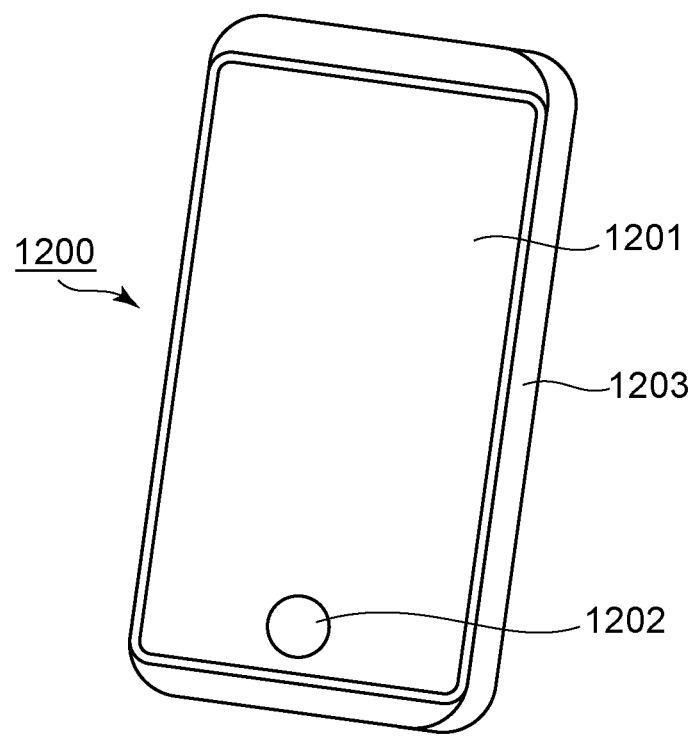
FIG. 14B is a schematic diagram illustrating an example of an electronic apparatus.

FIG. 14B is a schematic diagram illustrating an example of the electronic apparatus according to this embodiment. The electronic apparatus 1200 includes a display 1201, an operating unit 1202, and a casing 1203. The casing 1203 may include a circuit, a printed board including the circuit, a battery, and a communication unit. The operating unit 1202 may be either a button or a touch panel reacting unit. The operating unit 1202 may be a living-organism recognition unit that recognizes a fingerprint to release a lock, for example. The electronic apparatus 1200 including the communication unit may also be referred to as a communication apparatus. The electronic apparatus 1200 may further include a camera function by including a lens and an image sensor. An image captured with the camera function is displayed on the display 1201. Example of the electronic apparatus include a smartphone and a notebook computer.

Figure 15A:
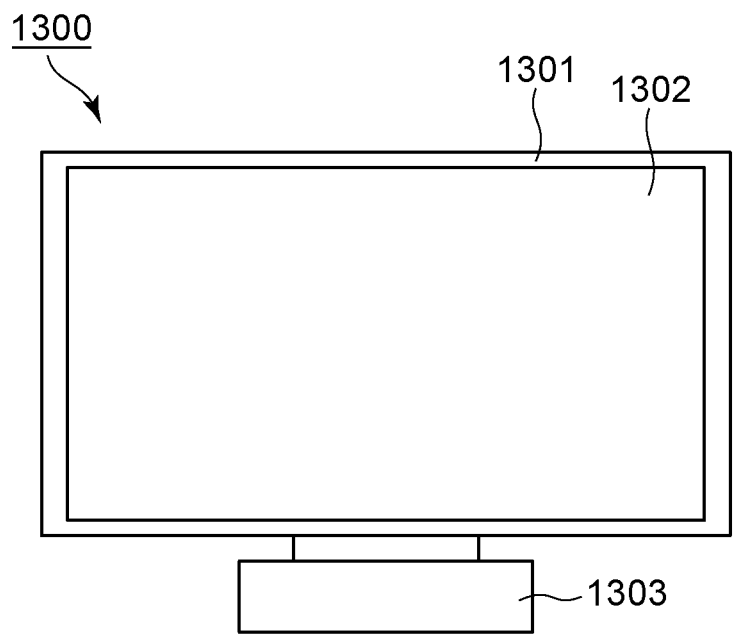
FIG. 15A is a schematic diagram illustrating an example of a display apparatus.
Figure 15B:
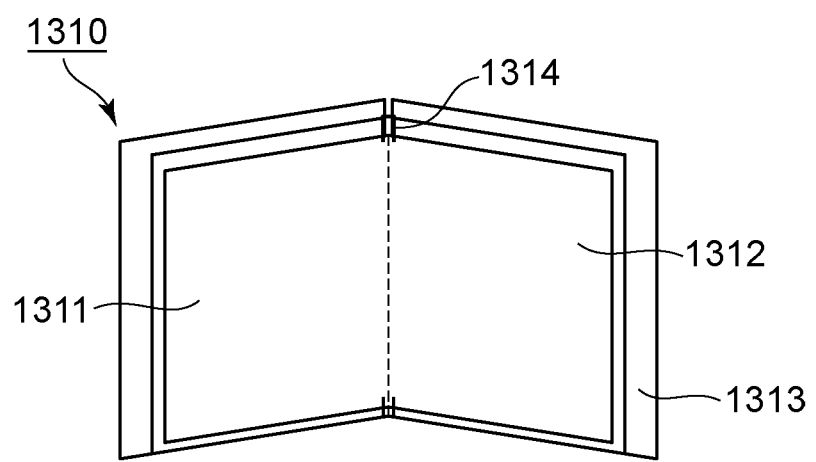
FIG. 15B is a schematic diagram illustrating another example of the display apparatus.

FIGS. 15A and 15B are schematic diagrams illustrating examples of the display apparatus according to this embodiment. FIG. 15A illustrates a display apparatus, such as a television monitor or a personal computer (PC) monitor. The display apparatus 1300 includes a frame 1301 and a display 1302. The display 1302 may include the light emitting apparatus according to this embodiment.

The display apparatus 1300 further includes a base 1303 that supports the display 1302 and the frame 1301. The configuration of the base 1303 is not limited to that in FIG. 15A. The lower side of the frame 1301 may serve as the base.

The frame 1301 and the display 1302 may be bent. The radius of curvature may be between 5,000 mm and 6,000 mm both inclusive.

FIG. 15B is a schematic diagram illustrating another example of the display apparatus according to this embodiment. The display apparatus 1310 of FIG. 15B is foldable, that is, a so-called foldable display apparatus. The display apparatus 1310 includes a first display 1311, a second display 1312, a casing 1313, and a folding point 1314. The first display 1311 and the second display 1312 may include the light emitting apparatus according to this embodiment. The first display 1311 and the second display 1312 may constitute a seamless display apparatus. The first display 1311 and the second display 1312 can be divided at the folding point. The first display 1311 and the second display 1312 may display different images or a single image together.

Figure 16A:
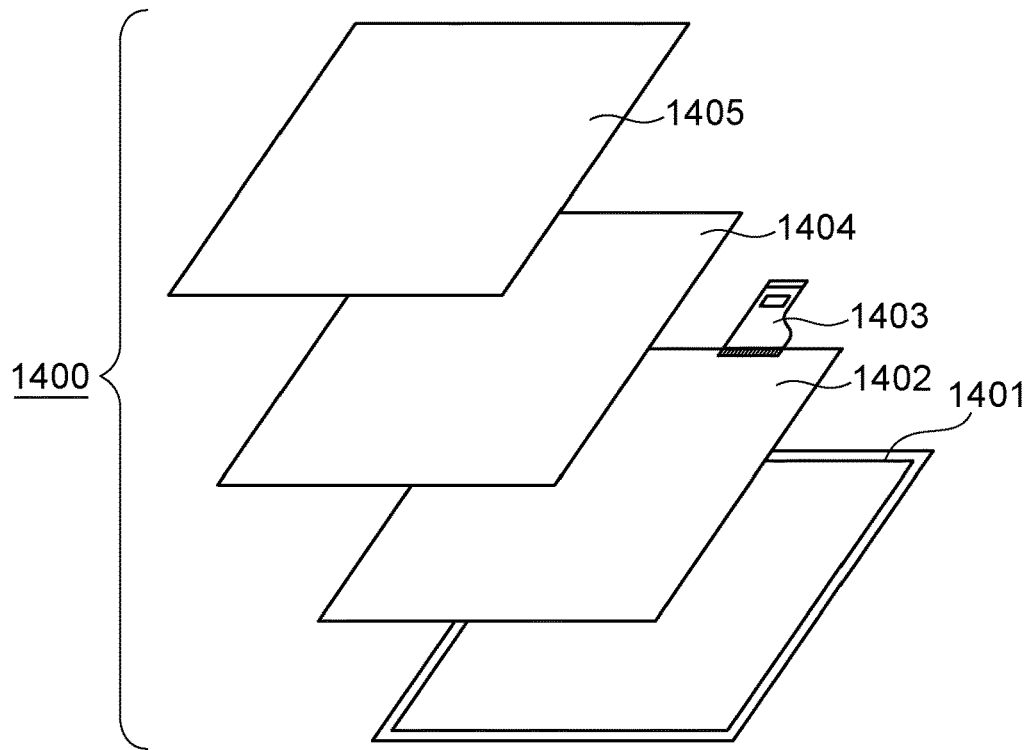
FIG. 16A is a schematic diagram illustrating an example of an illumination system.

FIG. 16A is a schematic diagram illustrating an example of an illumination system according to this embodiment. The illumination system 1400 may include a casing 1401, a light source 1402, a circuit board 1403, an optical filter 1404, and a light diffusing unit 1405. The light source 1402 may include the organic light emitting element according to this embodiment. The optical filter 1404 may be a filter that improves the color rendering properties of the light source 1402. The light diffusing unit 1404 effectively diffuses the light from the light source 1402, for example, lights up, to send light to a wide area. The optical filter 1404 and the light diffusing unit 1405 may be disposed on the emission side of the illumination. A cover may be provided at the outermost portion as necessary.

The illumination system 1400 is a system for illuminating a room interior, for example. The illumination system 1400 may emit any of white, daylight, blue, and red light. The illumination system 1400 may include a light modulating circuit that modulates the color.

The illumination system 1400 may include the organic light emitting element according to the embodiment of the present disclosure and a power source circuit connected thereto. The power source circuit converts alternating voltage to direct-current voltage. The white light has a color temperature of 4,200 K, and the daylight has a color temperature of 5,000 K. The illumination system 1400 may include a color filter.

The illumination system 1400 according to this embodiment may include a heat radiator. The heat radiator releases the heat in the illumination system 1400 to the outside. Example materials include metal and liquid silicon with high specific heat.

Figure 16B:
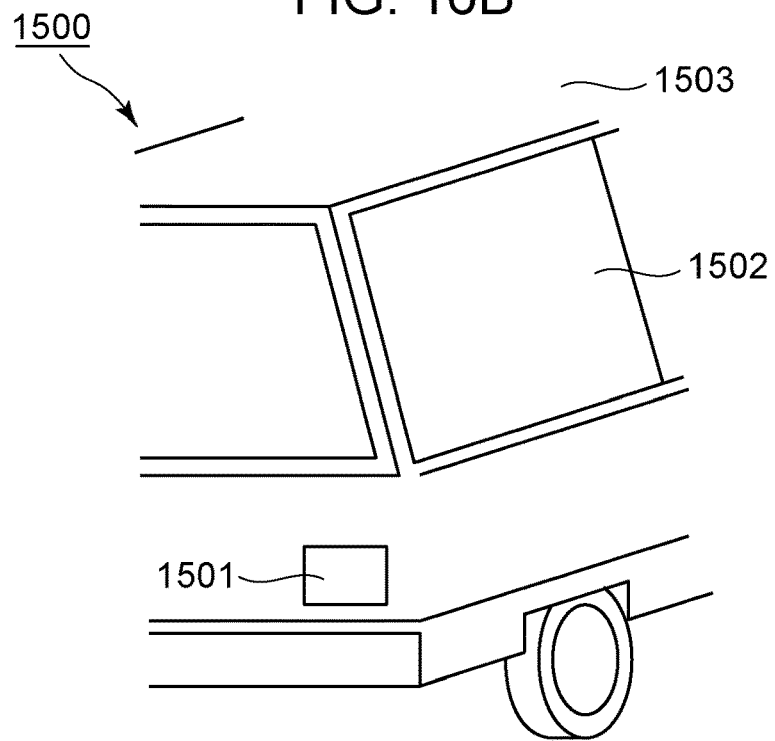
FIG. 16B is a schematic diagram of an automobile, which is an example of a moving object according to an embodiment.

FIG. 16B is a schematic diagram of an automobile, which is an example of a moving object according to this embodiment. The automobile includes a tail lamp, which is an example of lighting fixtures. The automobile 1500 may include a tail lamp 1501 and may be configured to light on the tail lamp 1501 at a brake operation or the like.

The tail lamp 1501 may include the organic light emitting element according to this embodiment. The tail lamp 1501 may include a protector that protects the organic EL device. The protector may be made of any transparent material with relatively high strength, such as polycarbonate. The polycarbonate may be mixed with a furandicarboxylic acid derivative, an acrylonitrile derivative, or the like.

The automobile 1500 may include a body 1503 and windows 1502 mounted thereto. The windows 1502 may include a transparent display if it is not a window for checking the front and back of the automobile 1500. The transparent display may include the organic light emitting element according to this embodiment. In this case, the components of the organic light emitting element, such as electrodes, are made of transparent members.

The moving object according to this embodiment may be a ship, an aircraft, a drone, or the like. The moving object may include a body and a lighting fixture provided on the body. The lighting fixture may emit light for indicating the position of the body. The lighting fixture includes the organic light emitting element according to this embodiment.

Figure 17A:
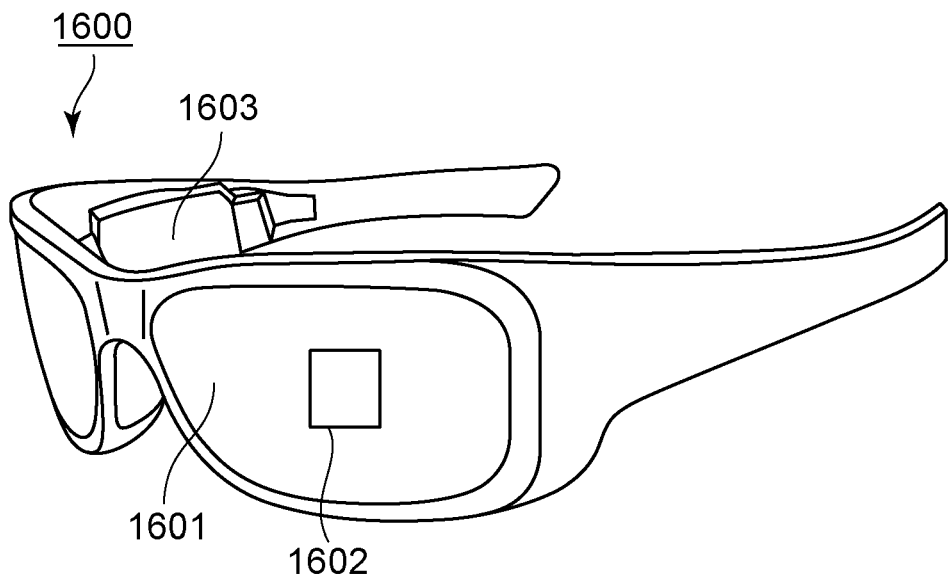
FIG. 17A is a schematic diagram illustrating an application of the display apparatus.
Figure 17B:
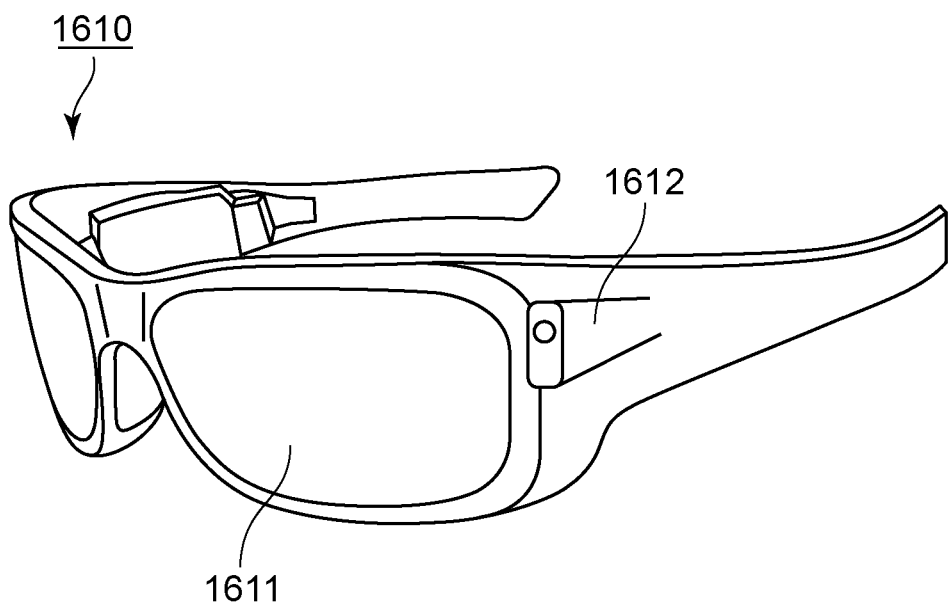
FIG. 17B is a schematic diagram illustrating an application of the display apparatus.

Referring to FIGS. 17A and 17B, an application example of the display apparatuses of the embodiments will be described. The display apparatuses are applicable to wearable devices, such as smartglasses, head-mounted displays (HMDs), and smart contact lenses. An image-capturing display apparatus used in such application examples includes an image capturing apparatus capable of photoelectrically converting visible light and a display apparatus capable of emitting visible light.

FIG. 17A illustrates a pair of glasses 1600 (smartglasses) according to an application. A pair of glasses 1600 is provided with an image capturing apparatus 1602, such as a complementary metal-oxide semiconductor (CMOS) sensor or a single photon avalanche diode (SPAD), on the surface of a lens 1601. The display apparatus of each embodiment is provided on the back of the lens 1601.

The pair of glasses 1600 further includes a control unit 1603. The control unit 1603 functions as a power source for supplying electricity to the image capturing apparatus 1602 and the display apparatus according to each embodiment. The control unit 1603 controls the operation of the image capturing apparatus 1602 and the display apparatus. The lens 1601 is provided with an optical system for collecting light to the image capturing apparatus 1602.

FIG. 17B illustrates a pair of glasses (smartglasses) 1610 according to an application. The pair of glasses 1610 includes a control unit 1612. The control unit 1612 is provided with an image capturing apparatus corresponding to the image capturing apparatus 1602 and a display apparatus. A lens 1611 is provided with an optical system for projecting the light from the image capturing apparatus in the control unit 1612 and the display apparatus, and an image is projected on the lens 1611. The control unit 1612 functions as a power source for supplying electricity to the image capturing apparatus and the display apparatus and controls the operation of the image capturing apparatus and the display apparatus. The control unit 1612 may include a gaze detection unit that detects the gaze of the wearer. The gaze detection may use infrared light. An infrared emission unit emits infrared light to the eyeball of a user who is looking at the displayed image. The image capturing unit including a light receiving element detects the reflected light of the infrared light from the eyeball, so that an image of the eyeball is obtained. A reducing unit that reduces light from the infrared emission unit to the display in plan view reduces a decrease in image quality.

The gaze of the user to the displayed image is detected from the image of the eyeball using infrared light. The gaze detection using an image captured by the eyeball may use any known technique. An example is an eye-gaze tracking method based on Purkinje images obtained by the reflection of illuminated light on the cornea.

More specifically, a gaze tracking process based on pupil center corneal reflection is performed. The gaze of the user is detected by calculating a gaze vector indicating the orientation (rotation angle) of the eyeball on the basis the image of the pupil contained in the image of the eyeball and Purkinje images using pupil center corneal reflection.

A display apparatus according to an embodiment of the present disclosure may include an image capturing apparatus including a light receiving element and may control an image displayed on the display apparatus on the basis of user gaze information provided from the image capturing apparatus.

Specifically, the display apparatus determines a first view area that the user gazes and a second view area other than the first view area on the basis of the gaze information. The first view area and the second view area may be determined by the control unit of the display apparatus or may be received from an external control unit. The display resolution of the first view area in the display area of the display apparatus may be set higher than the display resolution of the second view area. In other words, the resolution of the second view area may be set lower than the resolution of the first view area.

The display area includes a first display area and a second display area different from the first display area. A higher priority area is determined from the first display area and the second display area on the basis of the gaze information. The first view area and the second view area may be determined by the control unit of the display apparatus or may be received from an external control unit. The resolution of a higher priority area may be set higher than the resolution of the area other than the higher priority area. In other words, the resolution of the lower priority area may be set low.

The determination of the first view area and the higher priority area may use artificial intelligence (AI). The AI may be a model configured to estimate the angle of the gaze and the distance to the object of the gaze from the image of the eyeball using the image of the eyeball and the direction in which the eyeball in the image gazes actually. The AI program may be installed in the display apparatus, the image capturing apparatus, or an external apparatus. If the AI program is installed in an external apparatus, the AI program is sent to the display apparatus via communication.

Display control based on visual recognition allows application to smartglasses that further includes an image capturing apparatus that captures an external image. Smartglasses can display captured external information in real time.

Thus, the use of an apparatus including the organic light emitting element according to this embodiment allows stable display with high image quality even for long time display.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2020-192212, which was filed on Nov. 19, 2020 and which is hereby incorporated by reference herein in its entirety.

What is claimed is:

1. A display apparatus comprising:
   a plurality of pixels arranged on a main surface of a substrate,
   the plurality of pixels including a first pixel including a first sub-pixel that includes a first light emitting element and emits light of a first color and a second sub-pixel that includes a second light emitting element and emits light of a second color;
   a first lens disposed on a first light emitting area that is a light emitting area of the first light emitting element; and
   a second lens disposed on a second light emitting area that is a light emitting area of the second light emitting element,
   wherein a vector from a center of the first light emitting area in plan view from a direction perpendicular to the main surface to an apex of the first lens differs from a vector from a center of the second light emitting area to an apex of the second lens in plan view from the direction perpendicular to the main surface.

2. A display apparatus comprising:
   a plurality of pixels arranged on a main surface of a substrate,
   the plurality of pixels including a first pixel including a first sub-pixel that includes a first light emitting element and emits light of a first color and a second sub-pixel that includes a second light emitting element and emits light of a second color;
   a first lens disposed on a first light emitting area that is a light emitting area of the first light emitting element; and
   a second lens disposed on a second light emitting area that is a light emitting area of the second light emitting element,
   wherein a distance between a center of the first light emitting area and an apex of the first lens in plan view from a direction perpendicular to the main surface differs from a direction between a center of the second light emitting area and an apex of the second lens in plan view from the direction perpendicular to the main surface.

3. The display apparatus according to claim 1,
   wherein the plurality of pixels includes a second pixel including a third sub-pixel that includes a third light emitting element and emits light of the first color, wherein the display apparatus further comprises a third lens disposed on a third light emitting area that is a light emitting area of the third light emitting element, and wherein a difference between the center of the first light emitting area and the apex of the first lens in plan view from the direction perpendicular to the main surface and a distance between the center of the light emitting area of the second light emitting element and the apex of the second lens in plan view from the direction perpendicular to the main surface is larger than a difference between a distance between the center of the first light emitting area and the apex of the first lens in plan view from the direction perpendicular to the main surface and a distance between a center of the third light emitting area and an apex of the third lens in plan view from the direction perpendicular to the main surface.

4. A display apparatus comprising:

a first pixel and a second pixel arranged on a main surface of a substrate, the first pixel including a first sub-pixel that includes a first light emitting element and emits light of a first color and a second sub-pixel that includes a second light emitting element and emits light of second color, the second pixel including a third sub-pixel that includes a third light emitting element and emits light of the first color;

a first lens disposed on a first light emitting area that is a light emitting area of the first light emitting element;

a second lens disposed on a second light emitting area that is a light emitting area of the second light emitting element; and a third lens on a third light emitting area that is a light emitting area of the third light emitting element, wherein a difference between a center of the first light emitting area and an apex of the first lens in plan view from a direction perpendicular to the main surface and a distance between a center of the light emitting area of the second light emitting element and an apex of the second lens in plan view from the direction perpendicular to the main surface is larger than a difference between the distance between the center of the first light emitting area and the apex of the first lens in plan view from the direction perpendicular to the main surface and a distance between a center of the light emitting area of the third light emitting element and an apex of the third lens in plan view from the direction perpendicular to the main surface.

5. The display apparatus according to claim 3, wherein a distance between an end of a display area in which the first pixel and the second pixel are disposed and the first pixel is smaller than a distance between the end of the display area and the second pixel.

6. The display apparatus according to claim 3, wherein the second pixel includes a fourth sub-pixel that includes a fourth light emitting element and emits light of the second color, wherein the display apparatus comprises a fourth lens disposed on a fourth light emitting area that is a light emitting area of the fourth light emitting element, wherein a distance between the apex of the first lens and the apex of the third lens in plan view from the direction perpendicular to the main surface is equal to a distance between the apex of the second lens and an apex of the fourth lens in plan view from the direction perpendicular to the main surface, and wherein a distance between the center of the first light emitting area and the center of the third light emitting area in plan view from the direction perpendicular to the main surface differs from a direction between the center of the second light emitting area and a center of the fourth light emitting area in plan view from the direction perpendicular to the main surface.

7. The display apparatus according to claim 6, wherein the distance between the center of the first light emitting area and the center of the third light emitting area in plan view from the direction perpendicular to the main surface is smaller than the distance between the center of the second light emitting area and the center of the fourth light emitting area in plan view from the direction perpendicular to the main surface.

8. The display apparatus according to claim 3, wherein the second pixel includes a fourth sub-pixel that includes a fourth light emitting element and emits light of the second color, wherein the display apparatus further comprises a fourth lens disposed on a fourth light emitting area that is a light emitting area of the fourth light emitting element, wherein a distance between the apex of the first lens and the apex of the third lens in plan view from the direction perpendicular to the main surface differs from a distance between the apex of the second lens and an apex of the fourth lens in plan view from the direction perpendicular to the main surface, and wherein a difference between a distance between the center of the first light emitting area and the center of the third light emitting area in plan view from the direction perpendicular to the main surface and a distance between the center of the second light emitting area and a center of the fourth light emitting area in plan view from the direction perpendicular to the main surface is smaller than a distance between the apex of the first lens and the apex of the second lens in plan view from the direction perpendicular to the main surface.

9. The display apparatus according to claim 8, wherein the distance between the apex of the first lens and the apex of the third lens in plan view from the direction perpendicular to the main surface is larger than the distance between the apex of the second lens and the apex of the fourth lens in plan view from the direction perpendicular to the main surface.

10. The display apparatus according to claim 3, wherein a distance between an end of a display area in which the first pixel and the second pixel are disposed and the first pixel is smaller than a distance between the end of the display area and the second pixel, and wherein the distance between the center of the first light emitting area of the first light emitting element and the apex of the first lens in plan view from the direction perpendicular to the main surface is larger than the distance between the center of the third light emitting area of the third light emitting element and the apex of the third lens in plan view from the direction perpendicular to the main surface.

11. The display apparatus according to claim 1, further comprising:

a plurality of sets of a light emitting area and a lens disposed on the light emitting area, the sets including a set of the first light emitting area and the first lens and a set of the second light emitting area and the second lens, wherein a direction from a center of the light emitting area to an apex of the lens of each of the plurality of sets in the direction parallel to the main surface is a direction from a center of an area in which the plurality of sets is disposed to a periphery.

12. The display apparatus according to claim 1, wherein the first sub-pixel and the second sub-pixel are disposed next to each other.

13. The display apparatus according to claim 1, wherein each of a plurality of light emitting elements including the first light emitting element and the second light emitting element includes:

a lower electrode;

an organic layer that is disposed on the lower electrode and includes a light emitting layer;

an upper electrode disposed above the lower electrode with the organic layer disposed therebetween; and an insulating layer that covers an end of the lower electrode and has an opening on the lower electrode, wherein respective light emitting areas of the plurality of light emitting elements are each defined by the opening of the insulating layer in plan view from the direction perpendicular to the main surface.

14. The display apparatus according to claim 13, wherein the light emitting layer is disposed continuously between a top of a first lower electrode that is the lower electrode of the first sub-pixel and a top of a second lower electrode that is the lower electrode of the second sub-pixel.

15. The display apparatus according to claim 14, wherein the light emitting layer emits white light.

16. The display apparatus according to claim 1, further comprising:

a color filter, wherein the color filter is disposed between the first light emitting element and the first lens or on the first lens.

17. The display apparatus according to claim 13, wherein a distance between the upper electrode of the first light emitting element and the first lens in the direction perpendicular to the main surface is 0.1 μm or more and 1 mm or less.

18. The display apparatus according to claim 1, further comprising a transistor connected to electrodes of the first light emitting element.

19. A display apparatus comprising:

an image capturing apparatus; and the display apparatus according to claim 1 serving as a display, wherein an image to be displayed on the display is controlled based on user gaze information provided from the image capturing apparatus.

20. A photoelectric conversion apparatus comprising:

an optical unit including a plurality of lenses;

an image sensor that receives light that has passed through the optical unit; and a display that displays an image captured by the image sensor, wherein the display includes the display apparatus according to claim 1.

21. An electronic apparatus comprising:

a display including the display apparatus according to claim 1;

a casing in which the display is disposed; and a communication unit disposed in the casing and communicating with outside.

* * * * *